United States Patent
Takeuchi et al.

(10) Patent No.: US 7,465,955 B2
(45) Date of Patent: Dec. 16, 2008

(54) THIN-FILM TRANSISTOR AND METHOD OF FABRICATING SAME

(75) Inventors: Takayuki Takeuchi, Osaka (JP); Norishige Nanai, Osaka (JP)

(73) Assignee: Panasonic Corporation, Osaka (JP)

( * ) Notice: Subject to any disclaimer, the term of this patent is extended or adjusted under 35 U.S.C. 154(b) by 384 days.

(21) Appl. No.: 10/578,887

(22) PCT Filed: Jul. 22, 2004

(86) PCT No.: PCT/JP2004/010759

§ 371 (c)(1),
(2), (4) Date: May 11, 2006

(87) PCT Pub. No.: WO2005/045939

PCT Pub. Date: May 19, 2005

(65) Prior Publication Data

US 2007/0158641 A1    Jul. 12, 2007

(30) Foreign Application Priority Data

Nov. 11, 2003    (JP) .............................. 2003-381294

(51) Int. Cl.
*H01L 35/24* (2006.01)
*H01L 51/00* (2006.01)
(52) U.S. Cl. .................. 257/40; 257/192; 257/E51.027
(58) Field of Classification Search .................... 257/20, 257/24, 40, 192, E51.027
See application file for complete search history.

(56) References Cited

U.S. PATENT DOCUMENTS 5,500,537 A * 3/1996 Tsumura et al. ............... 257/40
6,107,117 A   8/2000 Bao et al.

FOREIGN PATENT DOCUMENTS

| JP | 5-275695 A | 10/1993 |
|---|---|---|
| JP | 7-206599 A | 8/1995 |
| JP | 9-83040 A | 3/1997 |
| JP | 9-116163 A | 5/1997 |
| JP | 10-190001 A | 7/1998 |
| JP | 2001-94107 A | 4/2001 |
| JP | 2002-9290 A | 1/2002 |
| JP | 2002-270621 A | 9/2002 |
| JP | 2002-309013 A | 10/2002 |
| JP | 2003-502874 A | 1/2003 |
| WO | WO 00/79617 A1 | 12/2000 |

* cited by examiner

*Primary Examiner*—Hoai V Pham
(74) *Attorney, Agent, or Firm*—McDermott Will & Emery LLP

(57) ABSTRACT

A thin film transistor of the present invention is a thin film transistor (100) having a semiconductor layer (14), a source region (15) and a drain region (16) provided to be isolated from each other so as to mutually oppose the semiconductor layer. The semiconductor layer has π-conjugated organic semiconductor molecules as its main component. The π-conjugated organic semiconductor molecules are oriented so that π orbitals substantially oppose each other and that the molecular axis of the main chains is oriented to be inclined with respect to a direction of electric field in a channel formed in the semiconductor layer.

12 Claims, 16 Drawing Sheets

Fig.3C

THIN-FILM TRANSISTOR AND METHOD OF FABRICATING SAME

This application is the U.S. National Phase under 35 U.S.C. § 371 of International Application No. PCT/JP2004/010759, filed on Jul. 22, 2004, which in turn claims the benefit of Japanese Application No. 2003-381294, filed on Nov. 11, 2003, the disclosures of which Applications are incorporated by reference herein.

TECHNICAL FIELD

The present invention relates to thin film transistors and methods of fabricating the same. More particularly, the invention relates to a thin film transistor employing as a semiconductor layer a π-conjugated organic semiconductor that is orientation-formed, and to a method of fabricating the same.

BACKGROUND ART

At present, thin film transistors (hereinafter referred to as "TFTs") are suitably used for driving elements in such devices as active matrix-type liquid crystal displays. Various configurations have been proposed as the configuration of the TFT, but a basic configuration is as follows; electric current flowing between a source electrode and a drain electrode, which are provided in contact with a semiconductor layer, is controlled by a voltage applied to a gate electrode (in other words, by electric field generated by the applied voltage), which is insulated from the semiconductor layer by an insulating layer. Examples of the semiconductor materials that have currently been utilized for the semiconductor layer that constitutes the TFT include amorphous silicon and low-temperature polysilicon, which are inferior to crystalline silicon in terms of performance but are relatively low in cost. Examples of the insulative materials that have currently been utilized for the insulating layer on which the gate electrode is provided include silicon oxide and silicon nitride. The manufacturing processes of the TFTs that use these semiconductor materials and insulative materials, however, require a large-scale system for a plasma CVD method or the like, or a thin film-controlling system for high-precision processing. Therefore, manufacturing cost of the TFTs is high. Moreover, the just-mentioned manufacturing processes generally involve a process with a temperature exceeding 350° C., and therefore impose restrictions on the substrate materials that can be used.

In recent years, organic semiconductors composed of organic compounds have attracted attention as semiconductor materials that can be utilized for TFTs. In contrast to the cases that use inorganic-based semiconductors, such as the above-mentioned amorphous silicon and low-temperature polysilicon, the organic semiconductors are capable of forming the semiconductor layer through such manufacturing processes as spin coating, ink jet printing, and dip coating, which are low-cost and low-temperature processes. Therefore, cost reduction in the manufacturing cost of TFTs is possible, and moreover, the restrictions to the usable substrate materials etc. are eliminated. Furthermore, since the just-mentioned low-cost processes and low-temperature processes are applicable, TFT fabrication on flexible substrates and large-area substrates can be realized, which is expected to widen the applications to large-screen displays, sheet-like or paper-like displays, wireless ID tags, and so forth. Nevertheless, the organic semiconductors reported to date have lower carrier mobilities than those of the inorganic-based semiconductors. Accordingly, various attempts have been made to achieve carrier mobility comparable to that of amorphous silicon.

Among the organic semiconductors, π-conjugated organic semiconductor is made of an organic compound composed of a molecular structure having a π-conjugated double bond. It is believed that the semiconductor properties are obtained due to the valence band, the conduction band, and the band gap therebetween, that are formed due to the overlap of π orbitals in the π-conjugated double bonds. In an aggregate of π-conjugated organic semiconductor molecules, electrical conductions are as follows, in descending order of ease of the electrical conduction; electrical conduction along the main chain direction in the molecules, electrical conduction making use of the overlap of π orbitals of the adjacent molecules, and electrical conduction originating from electron hopping between the molecules. Therefore, in order to improve the carrier mobility in the π-conjugated organic semiconductor molecules, an issue is how to achieve a configuration that can make use of an electrical conduction that is more effective in terms of the ease of electrical conduction among the electrical conductions. Accordingly, the method of controlling the orientation of the molecules to be in a certain direction has been adopted as a method for lessening the electrical conduction due to electron hopping between the molecules. Specific methods of the orienting that have been disclosed include a method in which a polysilane thin film is oriented using the Langmuir-Blodgett technique (LB technique) or a drawing technique (for example, Japanese Unexamined Patent Publication No. H05-275695). Another method disclosed is a method in which polytetrafluoroethylene is pressed onto a substrate with a certain pressure and is slid to form an orientation, and a oligothiophene compound is brought into contact with the upper surface of the orientation-formed polytetrafluoroethylene film to effect an orientation-deposition (for example, Japanese Unexamined Patent Publication No. H07-206599). Also disclosed is a method in which π-conjugated oligomer molecules are orientation-grown using a hot wall epitaxy method (for example, Japanese Unexamined Patent Publication: Japanese Unexamined Patent Publication No. 2002-270621). Using these methods of orienting can minimize the electrical conduction due to electron hopping between molecules.

In addition, methods for further improving carrier mobility have been proposed, including a method of controlling the orientation direction of π-conjugated organic semiconductor molecules to be parallel to the perpendicular line connecting the source electrode and the drain electrode in the TFT, to thereby attempt to make use of the electrical conduction along the main chain direction in the molecules effectively (for example, Japanese Unexamined Patent Publication No. 5-275695 and Published Japanese Translation of PCT Application No. 2003-502874), and a method of controlling the orientation direction of π-conjugated organic semiconductor molecules to be perpendicular to the perpendicular line connecting the source electrode and the drain electrode in the TFT, to thereby attempt to make use of the electrical conduction utilizing the overlap of the π orbitals of the adjacent molecules effectively (for example, Japanese Unexamined Patent Publication No. 9-116163).

In the method of controlling the orientation direction of the π-conjugated organic semiconductor molecules to be parallel to the linear line connecting the source electrode and the drain electrode of a TFT and thereby making use of the electrical conduction along the main chain direction of the π-conjugated organic semiconductor molecules to achieve high carrier mobility, the number of times of electron transfers between the π-conjugated organic semiconductor molecules gradually increases as the distance between the source electrode and the drain electrode increases relative to the molecular length of the main chain of the π-conjugated organic semiconductor molecule. In this case, the electron transfer between π-conjugated organic semiconductor molecules that are adjacent to each other perpendicularly to the perpendicular line connecting the source electrode and the drain electrode becomes very difficult because the electrons need to travel in the direction orthogonal to the direction in which electric field is formed between the source electrode and the drain electrode. Consequently, sufficient carrier mobility cannot be obtained even if the orientation direction of the π-conjugated organic semiconductor molecules is controlled to be parallel to the perpendicular line connecting the source electrode and the drain electrode of the TFT, except when using a π-conjugated organic semiconductor molecule having a molecular length much longer than the distance between the source electrode and the drain electrode, and when the distance between the source electrode and the drain electrode is sufficiently shorter than the molecular length of the π-conjugated organic semiconductor molecule.

On the other hand, in the method of controlling the orientation direction of the π-conjugated organic semiconductor molecules to be perpendicular to the perpendicular line connecting the source electrode and the drain electrode of the TFT, and making use of the overlap of π orbitals of the adjacent π-conjugated organic semiconductor molecules to thereby achieve high carrier mobility, the longitudinal axes of the main chains of the π-conjugated organic semiconductor molecules are aligned perpendicular to the perpendicular line connecting the source electrode and the drain electrode; therefore, the electrical conduction along the main chain direction in the π-conjugated organic semiconductor molecule does not serve the purpose, and mostly the electrical conduction making use of the overlap of π orbitals between the π-conjugated organic semiconductor molecules becomes dominant. For this reason, as the distance between the source electrode and the drain electrode increases, the number of times of electron transfer increases proportional to the increase in the distance. In short, there is a limit to the improvement in carrier mobility even if the orientation direction of the π-conjugated organic semiconductor molecules is controlled to be perpendicular to the perpendicular line connecting the source electrode and the drain electrode of the TFT and at the same time the degree of orientation is increased.

DISCLOSURE OF THE INVENTION

The present invention has been accomplished to resolve the foregoing problems, and it is a first object of the invention to provide a TFT with improved carrier mobility that is configured by orientation-forming π-conjugated organic semiconductor molecules in a predetermined direction, and to provide a method of fabricating the TFT. It is a second object of the invention to provide an active matrix-type display in which a plurality of the TFTs with improved carrier mobility are disposed, a wireless ID tag that uses the TFT with improved carrier mobility for its integrated circuit section, and a portable device, such as a portable television, a telecommunication terminal, a PDA, and a portable medical device, that uses the TFT with improved carrier mobility for the integrated circuit section.

In order to accomplish these objects, the present invention provides a thin film transistor comprising: a semiconductor layer; and a source region and a drain region provided to be isolated from each other so as to mutually oppose the semiconductor layer, wherein the semiconductor layer has π-conjugated organic semiconductor molecules as its main component; and the π-conjugated organic semiconductor molecules are oriented so that π orbitals thereof substantially oppose each other and that a molecular axis of main chains thereof is oriented to be inclined with respect to a direction of electric field in a channel formed in the semiconductor layer. In the present specification, the terms "source region" and "drain region" refer to the concept including the source electrode and the drain electrode, as well as the contact layer or the high-concentration impurity region (layer) and so forth for connecting the source electrode and the drain electrode to the semiconductor layer. Such a configuration enables to effectively utilize the charge transfer along the main chain direction in the π-conjugated organic semiconductor molecule and the charge transfer utilizing the overlap of π orbitals in the direction from the source region to the drain region to which electric field is applied; therefore, a TFT with high carrier mobility can be achieved.

In this case, a configuration may be adopted wherein the source region and the drain region are provided to be isolated from each other so as to have mutually opposing sides facing the semiconductor layer; and the π-conjugated organic semiconductor molecules are oriented so that the molecular axis of the main chains is inclined with respect to a direction perpendicular to the opposing sides. Alternatively, a configuration may be adopted wherein the source region and the drain region are provided to be isolated from each other so as to have mutually opposing planes facing the semiconductor layer; and the π-conjugated organic semiconductor molecules are oriented so that the molecular axis of the main chains is inclined with respect to a direction perpendicular to the opposing planes. According to such configurations, the molecular axis of the main chains of the π-conjugated organic semiconductor molecules is oriented to be inclined with respect to the direction perpendicular to the opposing sides of the source region and the drain region, and therefore, the electrical conduction along the main chain direction in the π-conjugated organic semiconductor molecule is effectively utilized for the charge transfer between the source region and the drain region. In addition, π orbitals of adjacent π-conjugated organic semiconductor molecules are formed so as to oppose one another in the direction from the source region to the drain region, and consequently, the transfer of electric charge between the molecules is effected due to, not the hopping, but mainly the charge transfer that makes use of the overlap of the π orbitals in the direction from the source region to the drain region to which electric field is applied. Therefore, a TFT with high carrier mobility can be achieved.

In the foregoing cases, it is preferable to adopt a configuration, to further comprise gate electrode provided on at least one surface of the semiconductor layer with a gate insulating layer interposed therebetween; and the molecular axis of the main chains of the π-conjugated organic semiconductor molecules is oriented substantially in an orientation direction inclined at an angle θ with respect to the direction perpendicular to the opposing sides or opposing planes of the source region and the drain region, the angle θ determined by the following equation (1):

$$\theta = \arctan(\sigma 2/\sigma 1), \quad (1)$$

where σ1 is a conductivity along the molecular axis direction of the main chains of the π-conjugated organic semiconductor molecules and σ2 is a conductivity along the direction perpendicular to the molecular axis direction and along the π orbital axis direction, the conductivities being determined in a state in which a voltage substantially equivalent to that when the thin film transistor is on is applied to the gate electrode. According to such a configuration, the source region and the drain region are formed taking as a reference the direction in which the conductivity is highest in the state when the thin film transistor is ON, and therefore, a TFT with further higher carrier mobility can be achieved.

It is preferable that the present invention adopt a configuration wherein the molecular axis of the main chains of the π-conjugated organic semiconductor molecules is oriented so as to exist within a plane substantially parallel to a principal plane of the semiconductor layer, and a range of the orientation is the angle θ±10°. Such a configuration achieves a TFT having high carrier mobility with a material capable of orienting the molecular axis of the main chains of the π-conjugated organic semiconductor molecules within the plane substantially parallel to the principal plane of the semiconductor layer.

It is preferable that the present invention adopt a configuration wherein the molecular axis of the main chains of the π-conjugated organic semiconductor molecules is oriented so as not to exist within a plane substantially parallel to the principal plane of the semiconductor layer, and a range of the orientation is the angle θ±5°. Such a configuration achieves a TFT having high carrier mobility with a material capable of orienting the molecular axis of the main chains of the π-conjugated organic semiconductor molecules to be inclined at a predetermined angle with respect to the plane substantially parallel to the principal plane of the semiconductor layer.

The present invention may adopt a configuration wherein the π-conjugated organic semiconductor molecules are made of a derivative having as its main chain a molecular structure of one of thiophene, acetylene, pyrrole, phenylene, and acene, or combinations thereof. Such a configuration achieves charge transfer in the π-conjugated system with high carrier mobility.

It is preferable that the present invention adopt a configuration wherein the π orbitals do not extend from the π-conjugated organic semiconductor molecules in the same vector direction. According to such a configuration, since the directions extended from the π orbitals in one π-conjugated organic semiconductor molecule are not the same vector direction, the π orbitals of adjacent π-conjugated organic semiconductor molecules are made to oppose each other easily by making the molecular axis directions of the main chains uniform.

It is more preferable that the present invention adopt a configuration wherein the π-conjugated organic semiconductor molecules are crystalline. Such a configuration makes it possible to enhance the degree of orientation higher than that in the case of using non-crystalline molecules and therefore can achieve a TFT with further higher carrier mobility.

The present invention also provides a method of fabricating a thin film transistor having a semiconductor layer, and a source region and a drain region provided to be isolated from each other so as to mutually oppose the semiconductor layer, the TFT fabricating method comprising: using π-conjugated organic semiconductor molecules for the semiconductor layer as its main component; and orienting the π-conjugated organic semiconductor molecules so that π orbitals substantially oppose each other, and that a molecular axis of main chains thereof is oriented to be inclined with respect to a direction of electric field in a channel formed in the semiconductor layer. Such a configuration enables to effectively utilize the charge transfer along the main chain direction in the π-conjugated organic semiconductor molecule and the charge transfer utilizing the overlap of π orbitals in the direction from the source region to the drain region to which electric field is applied; therefore, a TFT with high carrier mobility can be achieved.

In this case, a configuration may be adopted, which further comprises: providing the source region and the drain region to be isolated from each other so as to have mutually opposing sides facing the semiconductor layer; and orienting the π-conjugated organic semiconductor molecules so that the molecular axis of the main chains is inclined with respect to a direction perpendicular to the opposing sides. Alternatively, a configuration may be adopted, which further comprises: providing the source region and the drain region to be isolated from each other so as to have mutually opposing planes facing the semiconductor layer; and orienting the π-conjugated organic semiconductor molecules so that the molecular axis of the main chains is inclined with respect to a direction perpendicular to the opposing planes. According to such configurations, the molecular axis of the main chains of the π-conjugated organic semiconductor molecules is oriented to be inclined with respect to the direction perpendicular to the opposing sides of the source region and the drain region, and therefore, the electrical conduction along the main chain direction in the π-conjugated organic semiconductor molecule is effectively utilized for the charge transfer between the source region and the drain region. In addition, π orbitals of adjacent π-conjugated organic semiconductor molecules are formed opposing one another in the direction from the source region to the drain region, and consequently, the transfer of electric charge between the molecules is effected due to, not the hopping, but mainly the charge transfer that makes use of the overlap of the π orbitals in the direction from the source region to the drain region to which electric field is applied. Therefore, a TFT with high carrier mobility can be manufactured.

In the foregoing cases, it is preferable to adopt a configuration further comprising: providing a gate electrode on at least one surface of the semiconductor layer with a gate insulating layer interposed therebetween; and orienting the molecular axis of the main chains of the π-conjugated organic semiconductor molecules substantially in an orientation direction inclined at an angle θ with respect to the direction perpendicular to the opposing sides or opposing planes of the source region and the drain region, the angle θ determined by the following equation (1):

$$\theta = \arctan(\sigma 2/\sigma 1), \quad (1)$$

where σ1 is a conductivity along the molecular axis direction of the main chains of the π-conjugated organic semiconductor molecules and σ2 is a conductivity along the direction perpendicular to the molecular axis direction and along the π orbital axis direction, the conductivities being determined in a state in which a voltage substantially equivalent to that when the thin film transistor is on is applied to the gate electrode. According to such a configuration, the source region and the drain region are formed taking as a reference the direction in which the conductivity is highest in the state when the thin film transistor is ON, and therefore, a TFT with further higher carrier mobility can be manufactured.

It is preferable that the present invention adopt a configuration further comprising: orienting the molecular axis of the main chains of the π-conjugated organic semiconductor molecules so as to exist within a plane substantially parallel to the principal plane of the semiconductor layer, and setting a range of the orientation to be the angle θ±10°. Such a configuration makes it possible to manufacture a TFT having high carrier mobility with a material capable of orienting the molecular axis of the main chains of the π-conjugated organic semiconductor molecules within the plane substantially parallel to the principal plane of the semiconductor layer.

It is preferable that the present invention adopt a configuration further comprising: orienting the molecular axis of the main chains of the π-conjugated organic semiconductor molecules so as not to exist within a plane substantially parallel to the principal plane of the semiconductor layer, and setting a range of the orientation to be the angle θ±5°. Such a configuration makes it possible to manufacture a TFT having high carrier mobility with a material capable of orienting the molecular axis of the main chains of the π-conjugated organic semiconductor molecules to be inclined at a predetermined angle with respect to the plane substantially parallel to the principal plane of the semiconductor layer.

The present invention may adopt a configuration wherein a derivative having as its main chain a molecular structure of one of thiophene, acetylene, pyrrole, phenylene, and acene, or combinations thereof, is used as the π-conjugated organic semiconductor molecules. Such a configuration achieves charge transfer in the π-conjugated system with high carrier mobility.

The present invention also provides an active matrix-type display comprising a plurality of thin film transistors according to any one of claims 1 through 9 as switching elements for driving pixels. Such a configuration makes it possible to embody a low-cost, high-performance sheet-like or paper-like display.

The present invention also provides a wireless ID tag comprising a thin film transistor according to any one of claims 1 through 9 as a semiconductor element for constructing an integrated circuit. Such a configuration enables the wireless ID tag to adhere onto various objects or materials with various shapes. Moreover, it is possible to embody a wireless ID tag that can be formed into a desired shape.

The present invention also provides a portable device comprising a thin film transistor according to any one of claims 1 through 9 as a semiconductor element for constructing an integrated circuit. Herein, examples of the portable device include a portable television, a telecommunication terminal, a PDA, and a portable medical device. However, the examples are not limited to these portable devices and may include any portable devices, such as mobile AV devices and mobile computers. Such a configuration makes it possible to add such advantages as low cost, flexibility, shock resistance, and formability into arbitrarily shapes to the portable devices including portable televisions, telecommunication terminals, PDAs, and portable medical devices.

The foregoing and other objects, features and advantages of the present invention will become more readily apparent from the following detailed description of preferred embodiments of the invention, with reference to the accompanying drawings.

BRIEF DESCRIPTION OF THE DRAWINGS

FIG. 3 shows the structure of an oligothiophene derivative molecule, a π-conjugated organic semiconductor molecule used for the semiconductor layer, wherein FIG. 3C is a perspective view schematically illustrating the molecule.

FIG. 6 is graphs illustrating the results of measurements in which changes of carrier mobility are measured at varying orientation angles of oligothiophene derivative molecules, while applying various gate voltages, wherein

FIG. 8 shows the structure of pentacene, which is a π-conjugated organic semiconductor molecule used for the semiconductor layer, wherein

FIG. 10 is graphs illustrating the results of measurements in which changes of carrier mobility are measured at varying orientation angles of pentacene, with applying various gate voltages, wherein

BEST MODE FOR CARRYING OUT THE INVENTION

Hereinbelow, embodiments of the present invention are described with reference to the drawings.

First Embodiment

A first embodiment of the present invention describes a case in which an oligothiophene derivative is used as the π-conjugated organic semiconductor molecule that constitutes the semiconductor layer of a TFT.

FIG. 1 is cross-sectional views schematically illustrating first representative configurations of TFTs.

Figure 1A:
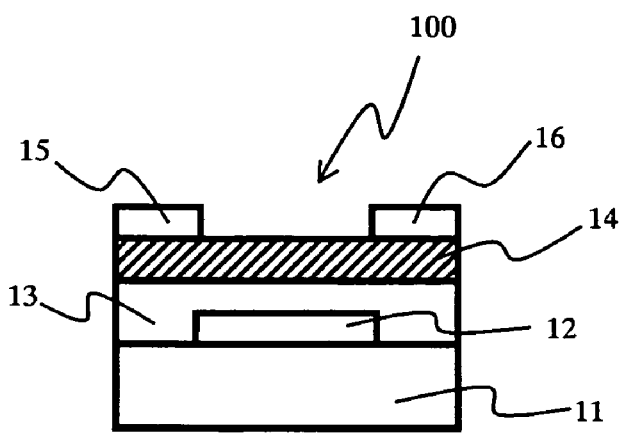
FIG. 1 is cross-sectional views schematically illustrating first representative configurations of TFTs.
Figure 1B:
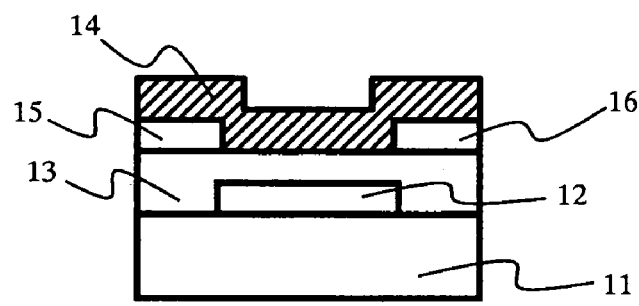
Figure 1C:
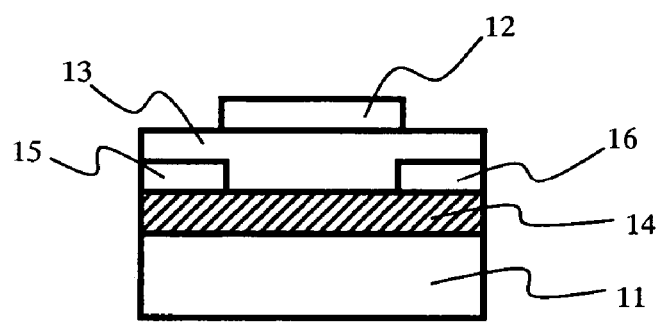
Figure 1D:
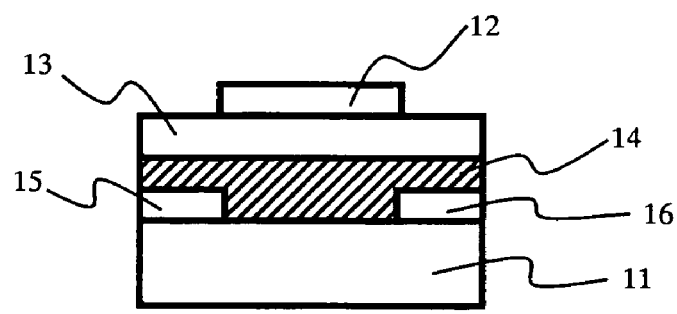

As illustrated in FIGS. 1A to 1D, various configurations are conceived as the configuration of a TFT 100 according to the present embodiment. In all the configurations, the TFT is furnished with a substrate 11, a gate electrode 12, a gate insulating layer 13, a semiconductor layer 14, a source electrode 15, and a drain electrode 16. Generally, the configurations of FIGS. 1A and 1B are referred to as the bottom gate design. On the other hand, the configurations of FIGS. 1C and 1D are referred to as the top gate design. At the same time, because of the positional relationship of the semiconductor layer 14 with the source electrode 15 and the drain electrode 16, the configurations of FIGS. 1A and 1C are also referred to as the top contact design. Likewise, the configurations of FIGS. 1B and 1D are also referred to as the bottom contact design. The TFTs 100 shown in FIGS. 1A to 1D are called horizontal type TFTs because the source electrode 15 and the drain electrode 16 are disposed so as to oppose each other horizontally when viewed in cross section.

In contrast to the conventional horizontal type TFTs shown in FIGS. 1A to 1D, vertical type TFTs have been proposed in recent years, in which the source electrode 15 and the drain electrode 16 are disposed so as to oppose each other vertically when viewed in cross section.

FIG. 2 shows cross-sectional views schematically illustrating second representative configurations of a TFT.

Figure 2A:
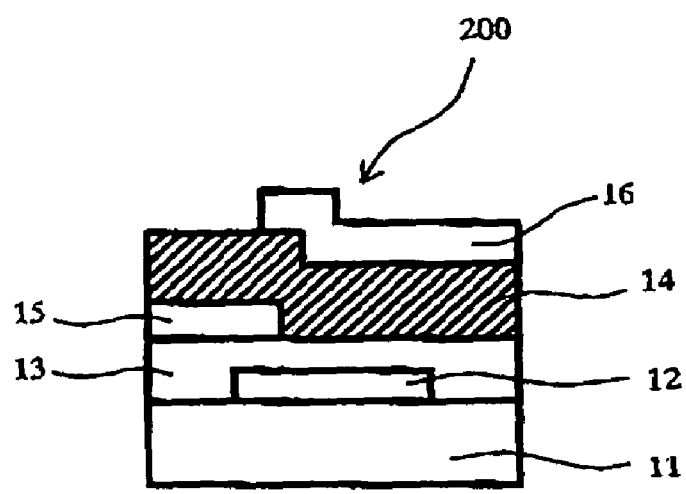
FIG. 2 is cross-sectional views schematically illustrating second representative configurations of TFTs.
Figure 2B:
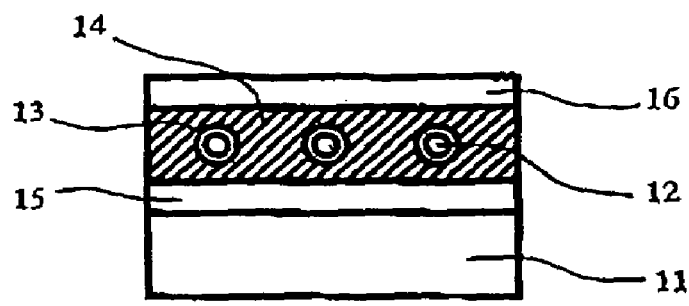

As illustrated in FIGS. 2A and 2B, the configurations of TFTs 200 according to the present embodiment are basically similar to those of the TFTs 100 shown in FIGS. 1A to 1D in the respect that it comprises as its constituent components the substrate 11, the gate electrode 12, the gate insulating layer 13, the semiconductor layer 14, the source electrode 15, and the drain electrode 16. In the TFTs 200 according to the present embodiment, however, the source electrode 15 and the drain electrode 16 are disposed so as to oppose each other so that the semiconductor layer 14 is interposed therebetween along the film thickness direction (vertically), in both configurations of FIGS. 2A and 2B. For this reason, the TFTs 200 are called vertical type TFTs.

It should be noted that since the advantageous effects achieved by the present invention are attained by controlling the orientation direction of the π-conjugated organic semiconductor molecules used for the semiconductor layer to be in an appropriate direction with respect to the disposition of the source electrode and the drain electrode, the configuration of the TFT itself may be either of the configurations shown in FIG. 1 or 2; that is, the configuration is not limited to either one of the configurations. Accordingly, the following description discusses cases in which the configuration of the TFT 100 with the top gate design shown in FIG. 1C is employed as a representative example of the configuration of the TFT.

As illustrated in FIG. 1C, the TFT 100 employing the top gate design has a substrate 11, a semiconductor layer 14 made of π-conjugated organic semiconductor molecules, a source electrode 15, a drain electrode 16, a gate insulating layer 13, and a gate electrode 12. Specifically, the semiconductor layer 14 is provided on the major surface of the substrate 11, and the source electrode 15 and the drain electrode 16 are provided on the semiconductor layer 14 so as to be isolated from each other. In addition, the gate insulating layer 13 is provided so as to cover the exposed surfaces of the source electrode 15, the drain electrode 16, and the semiconductor layer 14. Moreover, the gate electrode 12 is provided on the gate insulating layer 13 so as to be positioned at least between the source electrode 15 and the drain electrode 16 when viewed in plan. Thus, the TFT 100 that employs the top gate design shown in FIG. 1C has a configuration in which the semiconductor layer 14, the source electrode 15, the drain electrode 16, and the gate insulating layer 13 are stacked on top of the substrate 11, and the gate electrode 12 is arranged on the gate insulating layer 13.

In fabricating the TFT 100 having the above-described configuration, first, π-conjugated organic semiconductor molecules dissolved and dispersed in a predetermined solvent are applied on the substrate 11 in which grooves are formed parallel to a desired orientation direction in advance. Then, the substrate 11 on which the π-conjugated organic semiconductor molecules have been applied is sufficiently dried, whereby the semiconductor layer 14 made of the π-conjugated organic semiconductor molecules is orientation-formed on the substrate 11. Next, in order to form the source electrode 15 and the drain electrode 16 on the semiconductor layer 14 made of the π-conjugated organic semiconductor molecules, a predetermined electrode material is printed so as to form desired shapes using a screen that has been patterned in advance, and is thereafter dried sufficiently. Thereby, the source electrode 15 and the drain electrode 16 are formed on the semiconductor layer 14 in desired shapes. Thereafter, in order to form the gate insulating layer 13, a predetermined insulative material is printed on the source electrode 15, the drain electrode 16, and the semiconductor layer 14 using a screen that has been patterned in advance, and is thereafter dried sufficiently. Thereby, the gate insulating layer 13 having a desired shape is formed on the semiconductor layer 14, the source electrode 15, and the drain electrode 16. Lastly, in order to form the gate electrode 12 on the gate insulating layer 13, a predetermined electrode material is printed so as to form a desired shape using a screen that has been patterned in advance, and this is sufficiently dried, in a similar manner to the foregoing. Thereby, the gate electrode 12 having a desired shape is formed on the gate insulating layer 13. Thus, each of the semiconductor layer 14, the source electrode 15, the drain electrode 16, the gate insulating layer 13, and the gate electrode 12 is formed on top of the substrate 11 by a printing method using a screen and is thereafter sufficiently dried, whereby the TFT 100 is formed.

In the TFT 100 of the present embodiment, the substrate 11 was made of a polyethylene-based plastic substrate. The semiconductor layer 14 was made of oligothiophene derivative molecules, one type of π-conjugated organic semiconductor molecules. The source electrode 15, the drain electrode 16, and the gate electrode 12 were made of an electrode material containing poly(3,4-ethylenedioxythiophene) (hereinafter referred to as "PEDOT") as its main component. The gate insulating layer 13 was made of polyvinyl phenol.

First, the oligothiophene derivative molecules, the π-conjugated organic semiconductor molecules used for the semiconductor layer 14, will be described in detail.

Figure 3A:
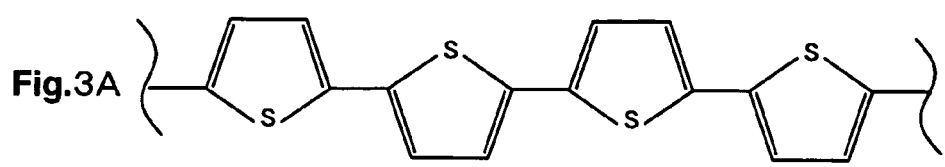
FIG. 3A shows its structural formula.
Figure 3B:
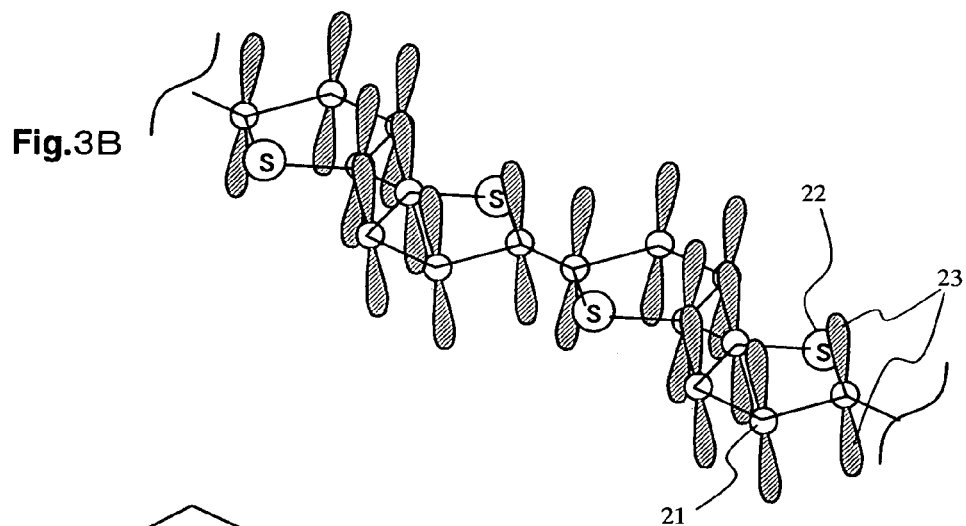
FIG. 3B shows the state of σ bonds and π-electron clouds.

FIG. 3 shows the structure of the oligothiophene derivative molecule, which is the π-conjugated organic semiconductor molecule used for the semiconductor layer. Here, FIG. 3A shows the structural formula of the oligothiophene derivative molecule, FIG. 3B shows the state of σ bonds and π-electron clouds in the oligothiophene derivative molecule, and FIG. 3C is a perspective view schematically illustrating the oligothiophene derivative molecule. In FIG. 3A, the chemical structure of the terminals of the main chain of the oligothiophene derivative molecule is not shown.

As illustrated in FIG. 3A, a π-conjugated system in which five-membered rings each containing a sulfur atom (S) and having double bonds are bonded repetitively by σ bonds, is developed in the main chain of the oligothiophene derivative molecule. It should be noted that FIG. 3A does not depict hydrogen atoms. Here, by calculating the electronic state using such a technique as the molecular orbital method, it is possible to determine the extent of the electron clouds of the π-electrons that form the n bonds in the double bonds. That is, in the oligothiophene derivative molecule, π-electron clouds 23 exist perpendicular to the plane of each five-membered ring composed of carbon atoms 21 and a sulfur atom 22, as illustrated in FIG. 3B. It should be noted that in the oligothiophene derivative molecule, the five-membered rings do not exist within the same plane, and they are bonded slightly twisted by σ bonds; therefore, the vectors indicating the directions of existence of the π-electron clouds 23 do not extend in a constant direction. In addition, the present embodiment employs, in reality, an oligothiophene derivative molecule in which the terminals of the main chain of an oligothiophene molecule are chemically modified by a predetermined substituent. Specifically, as illustrated in FIG. 3A, an oligothiophene derivative molecule is used that has 8 five-membered rings each containing a sulfur atom and in which both terminals of the main chain are chemically modified by an alkyl group (for example, —$C_{10}H_{21}$).

Next, the following describes an analysis method of the orientation angles of the oligothiophene derivative molecules, which characterizes the present invention, and the results of the analysis. It should be noted that in the following description, one molecule of the oligothiophene derivative molecules is represented by a strip-shaped quadrilateral, as illustrated in FIG. 3C. Also, although not all the vectors indicating the directions of existence of the π-electron clouds extend in the same direction in reality, the π-electron clouds are assumed to exist in substantially perpendicular directions with respect to the plane of this quadrilateral.

Figure 4:
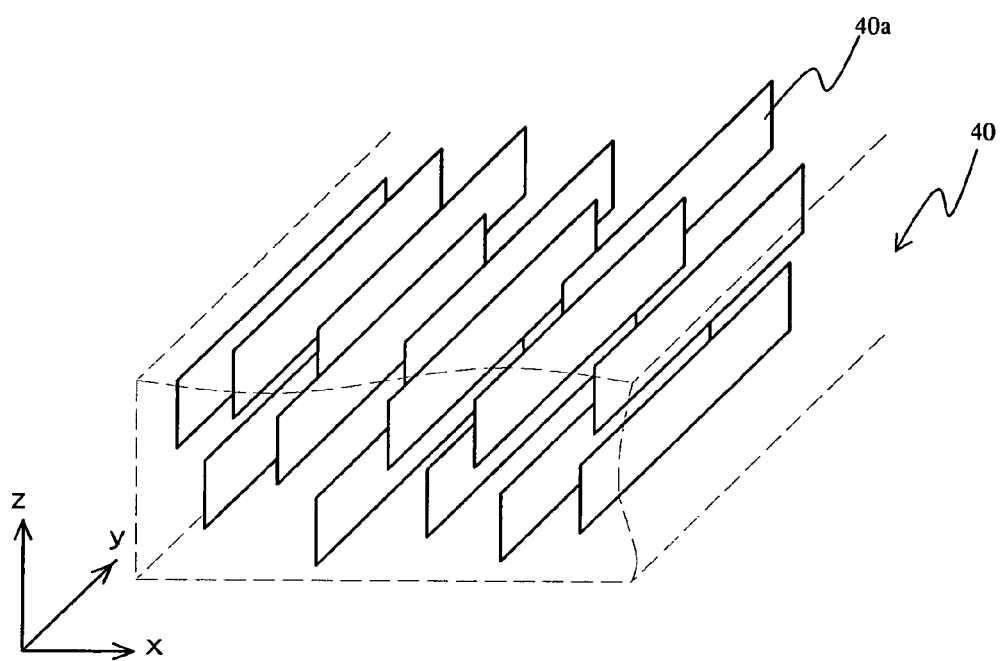
FIG. 4 is a perspective view schematically illustrating the orientation state of the oligothiophene derivative molecules in the semiconductor layer.

FIG. 4 is a perspective view schematically illustrating the orientation state of oligothiophene derivative molecules 40a in the semiconductor layer 40, which was obtained by the above-described fabricating method. Here, in FIG. 4, the plane formed by the X and Y axes represents a plane parallel to the principal plane of the semiconductor layer 40, and the Z-axis direction represents the thickness direction of the semiconductor layer 40.

In FIG. 4, the oligothiophene derivative molecules 40a are oriented so that the molecular axis of their main chains is parallel to the Y-axis direction and that the quadrilaterals each representing the molecular plane are parallel to the plane formed by the Y and Z axes. This means that the semiconductor layer 40 is constructed so that the π orbitals of adjacent oligothiophene derivative molecules oppose each other in a direction other than the Y-axis direction and the Z-axis direction, in other words, in the X-axis direction.

Figure 5:
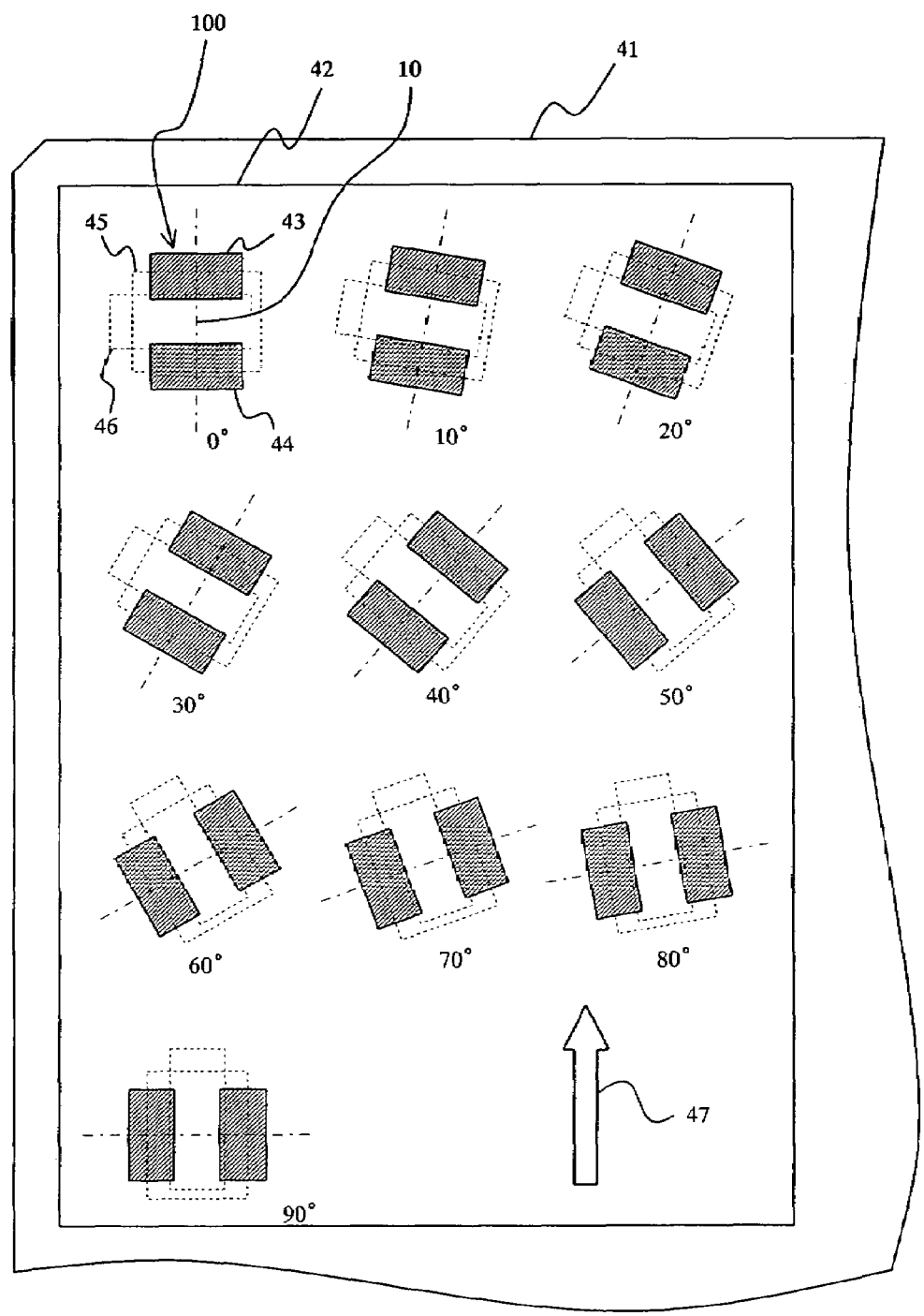
FIG. 5 is a schematic view illustrating the configuration of measurement samples for measuring carrier mobility of TFTs.

Using the semiconductor layer 40 thus orientation-formed, TFTs 100 were formed, as illustrated in FIG. 5, such that their perpendicular lines 10 to the opposing sides of the source electrodes and the drain electrodes, each having a rectangular shape, were inclined in 10° increments with respect to the Y-axis direction, which is the orientation direction of the oligothiophene derivative molecules 40a. That is, each of the oligothiophene derivative molecules 40a was oriented so that the π orbitals substantially oppose each other and that the molecular axis of the main chains was oriented so as to be inclined in 10° increments with respect to the perpendicular directions to the opposing sides of the source electrodes and the drain electrodes. Here, each of the thus-fabricated TFTs 100 is configured to have a plastic substrate 41, a semiconductor layer 42 composed of the semiconductor layer 40 shown in FIG. 4, a source electrode 43, a drain electrode 44, an insulating layer 45, and a gate electrode 46. It should be noted that arrow 47 indicates the orientation direction of the oligothiophene derivative molecules, which are not shown in FIG. 5, in the semiconductor layer 42.

For each of the measurement samples prepared in the above-described manner, the carrier mobility of the TFT 100 was determined by measuring I-V characteristics while applying various gate voltages to the gate electrode. In addition, angle θ was determined by obtaining the conductivity between the source electrode and the drain electrode in the case where an angle (orientation angle) formed by the perpendicular line 10 to the opposing sides of the source electrode 43 and the drain electrode 44 and the molecular axis of the main chains of the oligothiophene derivative molecules 40a was 0° (which corresponds to a conductivity σ1 along a direction represented by the molecular axis of the main chains of the π-conjugated organic semiconductor molecules) and the conductivity in the case where the angle was 90° (which corresponds to a conductivity σ2 along a perpendicular direction to the orientation direction and along a direction of existence of the π-electron clouds), and substituting these conductivity values into Equation (1). Here, "arctan" in Equation (1) means arc tangent $\tan^{-1}$.

$$\theta = \arctan(\sigma 2/\sigma 1) \quad (1)$$

Figure 6A:
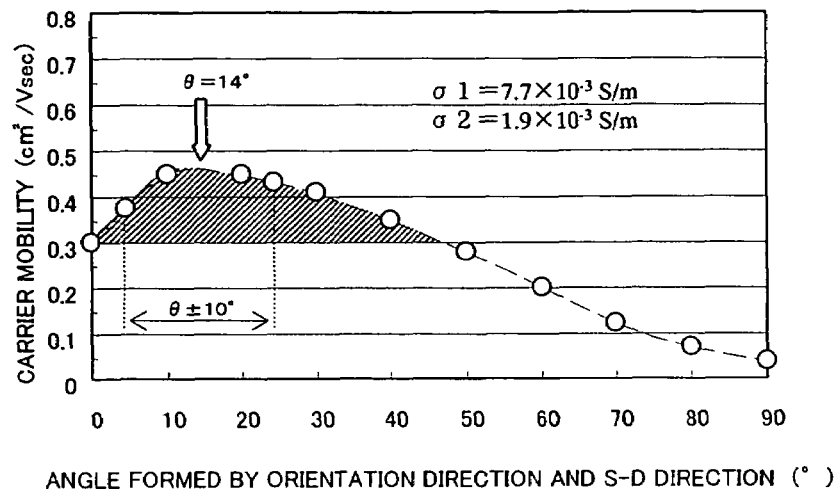
FIG. 6A shows the measurement results in the case where the gate voltage is 20 V.
Figure 6B:
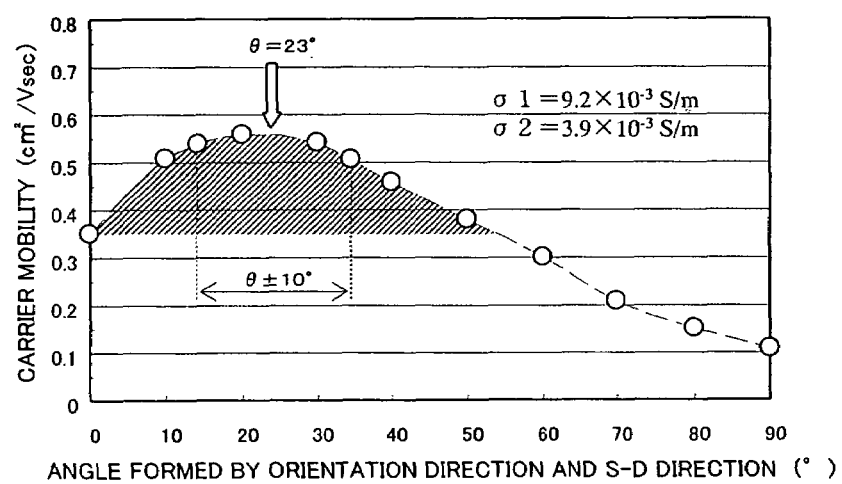
FIG. 6B shows the measurement results in the case where the gate voltage is 30 V.
Figure 6C:
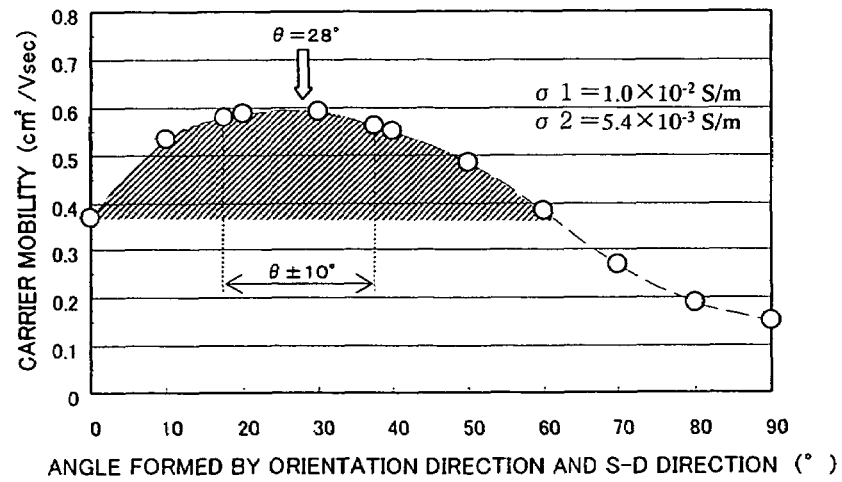
FIG. 6C shows the measurement results in the case where the gate voltage is 40 V.

FIG. 6 shows graphs illustrating the results of the measurements in which changes in the carrier mobility are measured at varying orientation angles of the oligothiophene derivative molecules while applying various gate voltages. FIG. 6A shows the measurement results in the case where the gate voltage is 20 V, FIG. 6B shows the measurement results in the case where the gate voltage is 30 V, and FIG. 6C shows the measurement results in the case where the gate voltage is 40 V. In FIG. 6, the horizontal axes represent angles (°) formed by the molecular axis of the main chains of the oligothiophene derivative molecules and the perpendicular line to the opposing sides of the source electrode and the drain electrode, while the vertical axes represent carrier mobility ($cm^2$/V sec).

As shown in FIG. 6A, when the gate voltage was 20 V, the conductivity σ1 was $7.7 \times 10^{-3}$ S/m and the conductivity σ2 was $1.9 \times 10^{-3}$ S/m. Although the carrier mobility increases as the orientation angle of the oligothiophene derivative molecules became greater from 0°, it gradually decreased when the orientation angle exceeded the vicinity of angle θ=14°, which was determined by the foregoing Equation (1), and the lowest carrier mobility was reached at an orientation angle of 90°.

Also, as illustrated in FIG. 6B, when the gate voltage was 30 V, the conductivity σ1 was $9.2 \times 10^{-3}$ S/m, and the conductivity σ2 was $3.9 \times 10^{-3}$ S/m. As in the case where the gate voltage was 20 V, although the carrier mobility increased as the orientation angle of the oligothiophene derivative molecules became greater from 0°, it gradually decreased when the orientation angle exceeded the vicinity of angle θ=23°, which was determined by the foregoing Equation (1), and the lowest carrier mobility was reached at an orientation angle of 90°.

Further, as illustrated in FIG. 6C, when the gate voltage was 40 V, the conductivity σ1 was $1.0 \times 10^{-2}$ S/m, and the conductivity σ2 was $5.4 \times 10^{-3}$ S/m. As in the cases where the gate voltage was 20 V and 30 V, although the carrier mobility increased as the orientation angle of the oligothiophene derivative molecules became greater from 0°, it gradually decreased when the orientation angle exceeded the vicinity of angle θ=28°, which was obtained by the foregoing Equation (1), and the lowest carrier mobility was reached at an orientation angle of 90°.

Thus, it was found that the carrier mobility becomes lowest when the orientation angle of the oligothiophene derivative molecules is 90°, that is, when the molecular axis of the main chains of the oligothiophene derivative molecules is perpendicular to a direction perpendicular to the opposing sides of the source electrode and the drain electrode. Also, it was found that the carrier mobilities in the hatched regions in FIGS. 6A to 6C improve in comparison with the case where the orientation angle of the oligothiophene derivative molecules is 0°, that is, the case where the oligothiophene derivative molecules are not formed so that the π orbitals of the adjacent molecules in the direction from the source electrode to the drain electrode oppose each other. Moreover, it was found that the orientation angle at which the highest carrier mobility is obtained is in the vicinity of the angle θ calculated according to Equation (1) using the conductivity σ1 in the case where the orientation angle is 0° and the conductivity σ2 in the case where the orientation angle is 90°. Furthermore, as the result of a further study on a preferable range of the orientation angle of the oligothiophene derivative molecules, it became clear that, as seen from FIGS. 6A to 6C, the range of ±10° from the angle θ determined by Equation (1) is most desirable.

Figure 7:
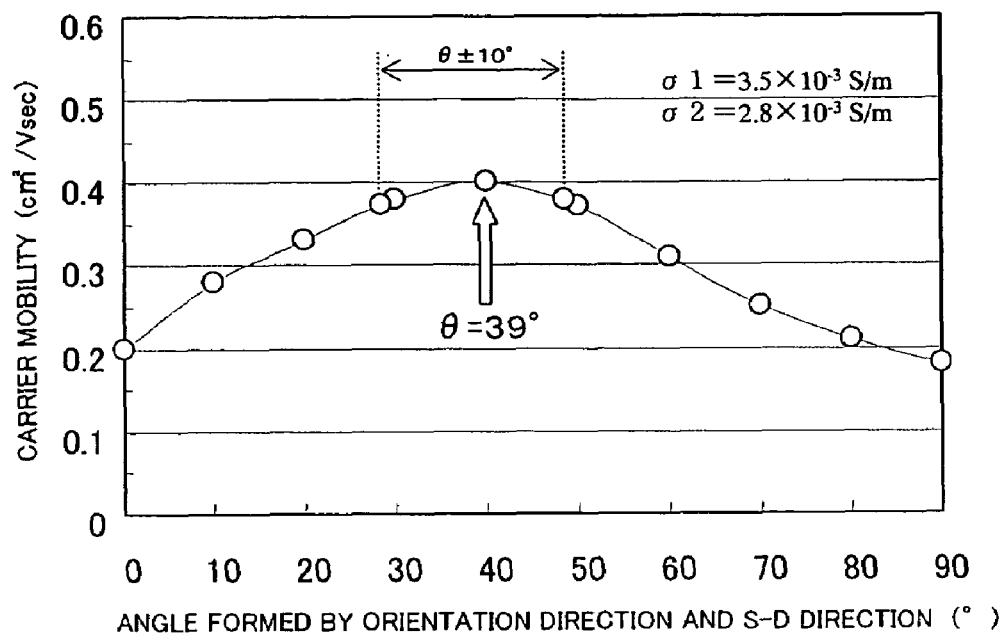
FIG. 7 is a graph illustrating the results of measurement in which the changes of carrier mobility is measured of a TFT using an oligothiophene derivative molecule that has 6 five-membered rings and in which both of the terminals are chemically modified by an alkyl group.

Further, in the present embodiment, similar measurement samples were fabricated using an oligothiophene derivative molecule that has 6 five-membered rings and in which both terminal ends were modified by an alkyl group (for example, —$C_{10}H_{21}$) as the oligothiophene derivative molecule used for the semiconductor layer 40, and measurements were performed. The results of the measurements are shown in FIG. 7. Here, the measurement results shown in FIG. 7 are those in the case where the gate voltage is 30 V. In FIG. 7, the horizontal axis and the vertical axis represent the same as in FIG. 6.

As shown in FIG. 7, it was found that when using the oligothiophene derivative molecule that has 6 five-membered rings and in which the terminals are chemically modified as above, the carrier motilities are approximately equal both in the case where the orientation angle of the oligothiophene derivative molecules is 0° and the case where it is 90°, and the carrier mobilities at the other orientation angles are improved over the carrier mobilities in the foregoing cases of 0° and 90°. Moreover, it was found that the highest carrier mobility is obtained in the vicinity of angle θ=39°, which is calculated according to Equation (1) using the conductivity σ1 in the case where the orientation angle is 0° and the conductivity σ2 in the case where the orientation angle is 90° in a similar manner to that in the foregoing case of using the oligothiophene derivative molecule having 8 five-membered rings. It also became clear that in this case as well, a preferable range of the orientation angle of the oligothiophene derivative molecules is, as illustrated in FIG. 7, the range of ±10° from the angle θ determined by Equation (1).

It should be noted that although the present embodiment has explained the cases of using, as the π-conjugated organic semiconductor molecules used for the semiconductor layer, the oligothiophene derivatives each of which has 8 or 6 five-membered rings and in which the terminals are modified by an alkyl group (for example, —$C_{10}H_{21}$), the advantageous effects of the present invention are not limited by the materials with such structures. In other words, because the advantageous effects attained by the present invention are achieved by the positional relationship between the arrangement direction of the source electrode and the drain electrode and the orientation direction of the semiconductor layer in a TFT, the same advantageous effects will be obtained even when other π-conjugated organic semiconductor molecules are used. For example, it is possible to use polythiophene derivatives having different numbers of five-membered rings, and it is possible to change the modifying groups for the terminals into other appropriate substituents. In addition, the modifying group may be introduced into the main chain, rather than the terminals.

Furthermore, although FIG. 4 schematically illustrates that the quadrilaterals that represent the oligothiophene derivative molecules are disposed parallel to the plane formed by the Y and Z axes, it is not necessary that all the quadrilaterals that represent the molecular planes are perfectly perpendicular to the plane formed by the X and Y axes. In other words, the molecular plane may be slightly inclined as far as the charge transfer that makes use of the overlap of π orbitals is possible, and moreover, the inclination need not be uniform. In that case, as with the oligothiophene derivative molecules used in the present example, those in which the vector directions indicating the directions of existence of the π-electron clouds do not extend in one direction allow the acceptable range of the inclination to be large; therefore, an advantageous effect is obtained that the TFT according to the present invention can be fabricated easily.

Second Embodiment

A second embodiment of the present invention describes a case in which pentacene is used as the π-conjugated organic semiconductor molecules that constitute the semiconductor layer of a TFT.

The present embodiment employs a TFT 100 having the configuration shown in FIG. 1B. It should be noted that the advantageous effects of the present invention are obtained by controlling the orientation direction of the semiconductor layer to be in an orientation with an appropriate angle with respect to the substrate plane. Therefore, the configuration of the TFT 100 itself is not limited to that shown in FIG. 1B.

As illustrated in FIG. 1B, the TFT 100 employing the bottom gate design has a substrate 11, a gate electrode 12, a gate insulating layer 13, a source electrode 15, a drain electrode 16, and a semiconductor layer 14 made of π-conjugated organic semiconductor molecules. Specifically, the gate electrode 12 is provided on the major surface of the substrate 11, and the gate insulating layer 13 is provided so as to cover the exposed surfaces of the gate electrode 12 and the substrate 11. The source electrode 15 and the drain electrode 16 are provided on the gate insulating layer 13 so as to be positioned on opposite sides of the gate electrode 12 when viewed in plan. The semiconductor layer 14 is provided so as to cover the exposed surfaces of the source electrode 5, the drain electrode 6, and the gate insulating layer 13. Thus, the TFT 100 employing the bottom gate design shown in FIG. 1B has a configuration in which the gate electrode 12, the gate insulating layer 13, the source electrode 15, the drain electrode 16, and the semiconductor layer 14 are stacked sequentially on top of the substrate 11.

In fabricating the TFT 100 having the above-described configuration, first, a predetermined electrode material is deposited on the substrate 11 by a vacuum evaporation method and is thereafter patterned, in order to form the gate electrode 12. Thereby, the gate electrode 12 having a predetermined shape is formed at a predetermined position on the substrate 11. Next, in order to form the gate insulating layer 13, a predetermined insulative material is applied by a spin coating method and is thereafter dried sufficiently. Subsequently, in order to form the source electrode 15 and the drain electrode 16, a predetermined electrode material is deposited by a vacuum evaporation method and is thereafter patterned. Thereby, the source electrode 15 and the drain electrode 16 having predetermined shapes are formed on the gate insulating layer 13. Lastly, in order to form the semiconductor layer 14, π-conjugated organic semiconductor molecules are deposited by a vacuum evaporation method and are thereafter patterned. At this time, the angle formed by the molecular axis of the just-mentioned π-conjugated organic semiconductor molecules and the plane of the substrate 11 was controlled by adjusting the conditions of the deposition. In addition, although an ordinary film deposition can align the directions of overlap of the π-conjugated organic semiconductor molecules grain by grain within a plane, it causes the directions of the overlap to be in random directions grain by grain when the layer is viewed as a whole. For this reason, in reality, an alignment layer was provided by applying and drying it on the gate insulating layer 13, which serves as the base layer, before the π-conjugated organic semiconductor molecules were deposited, so that uniform overlaps of the molecules could be obtained over the layer as a whole. Thus, the gate electrode 12, the gate insulating layer 13, the source electrode 15, the drain electrode 16, and the semiconductor layer 14 are deposited on top of the substrate 11 by a vacuum evaporation method or a spin coating method, and are patterned, whereby the TFT 100 is formed.

In the TFT 100 of the present embodiment, the substrate 11 was made of a polyethylene-based plastic substrate. The gate electrode 12 was made of gold (hereinafter "Au"). The gate insulating layer 13 was made of polyvinyl phenol. The source electrode 15 and the drain electrode 16 were made of Au. The semiconductor layer 14 was made of pentacene, which is one type of π-conjugated organic semiconductor molecules.

First, pentacene, a π-conjugated organic semiconductor molecule used for the semiconductor layer 14, will be described in detail.

Figure 8A:
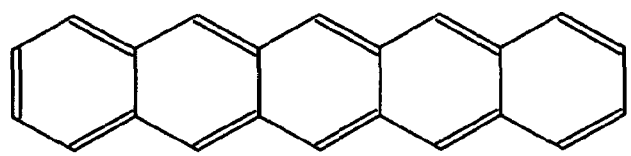
FIG. 8A shows the structural formula of pentacene.
Figure 8B:
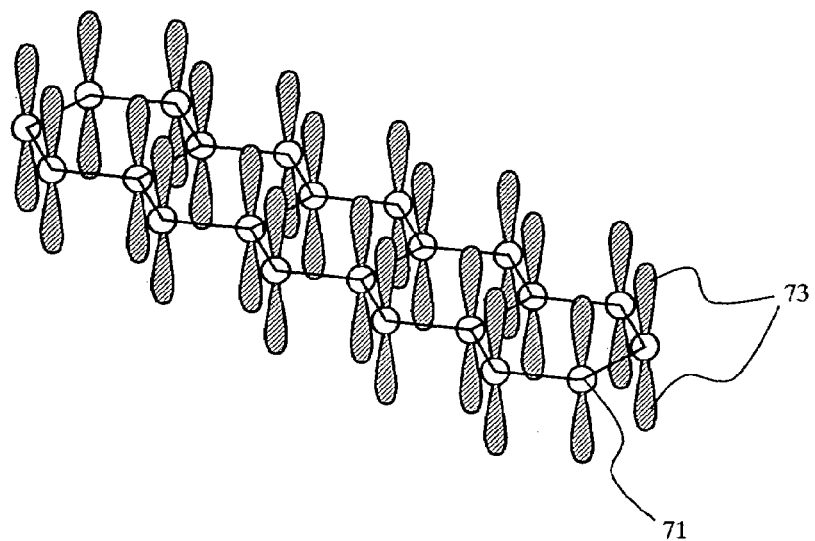
FIG. 8B shows the state of σ bonds and π-electron clouds in pentacene.
Figure 8C:
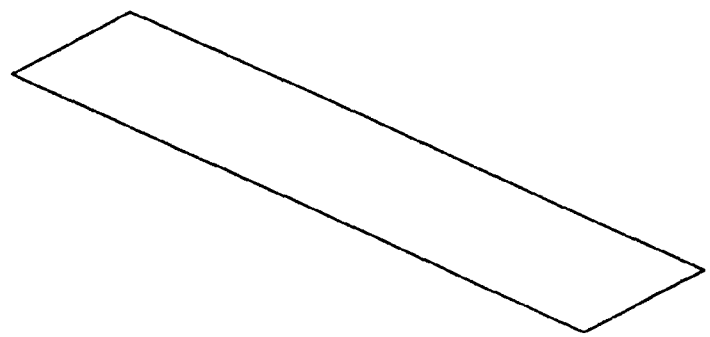
FIG. 8C is a perspective view schematically illustrating pentacene.

FIG. 8 is a view illustrating the structure of pentacene, which is a π-conjugated organic semiconductor molecule used for the semiconductor layer 14. Here, FIG. 8A shows the structural formula of the pentacene, FIG. 8B shows the state of σ bonds and π-electron clouds in the pentacene, and FIG. 8C is a perspective view schematically illustrating the pentacene.

As illustrated in FIG. 8A, a π-conjugated system in which six-membered rings each having a plurality of double bonds are bonded repetitively is developed in the main chain of the pentacene. It should be noted that FIG. 8A does not depict hydrogen atoms. Here, by calculating the electronic state using such a technique as the molecular orbital method, it is possible to determine the extent of an electron cloud of the π-electrons that form the π bonds in the double bonds. That is, in the pentacene, π-electron clouds 73 exist perpendicular to the plane of each six-membered ring composed of carbon atoms 71, as illustrated in FIG. 8B. It should be noted that in the pentacene, the six-membered rings exist within the same plane, and therefore the vectors indicating the directions of existence of the π-electron clouds 73 do not extend in a direction perpendicular to the plane of the quadrilateral shown in FIG. 8C.

Next, an analysis method of orientation angles of the pentacene, which characterizes the present invention, and the results of the analysis are described below. It should be noted that in the following description, one molecule of the pentacene is represented by a strip-shaped quadrilateral, as illustrated in FIG. 8C.

Figure 9:
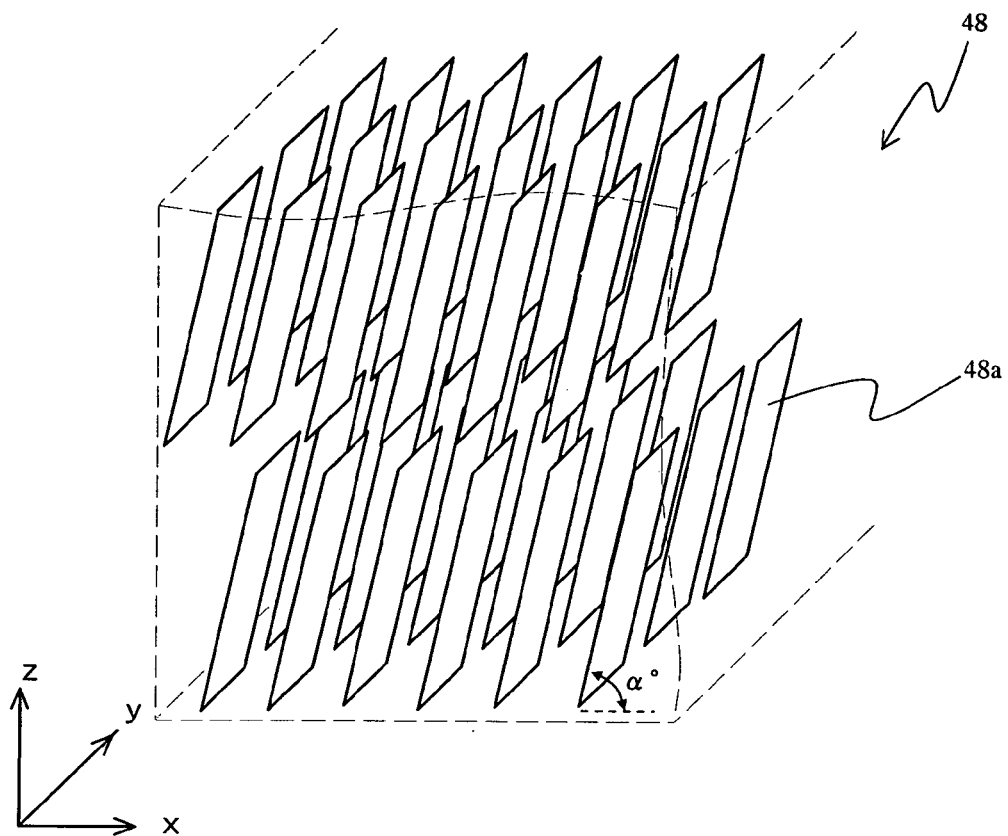
FIG. 9 is a perspective view schematically illustrating the orientation state of pentacene in the semiconductor layer.

FIG. 9 is a perspective view schematically illustrating the orientation state of pentacene 48a in the semiconductor layer 48, which is obtained by the above-described fabricating method. Here, in FIG. 9, the plane formed by the X and Y axes represents a plane parallel to the principal plane of the semiconductor layer 40, and the Z-axis direction represents the thickness direction of the semiconductor layer 48.

In FIG. 9, the pentacene 48a is oriented so that the molecular axis of the main chains forms an angle α° with the plane formed by the X and Y axes, and is configured so that the π orbitals of the adjacent molecules oppose each other in a direction in which the quadrilaterals representing the molecular planes are parallel to the X-axis. It should be noted that, with the semiconductor layer 48 formed in such a manner, the source electrode and the drain electrode are formed so that the X-axis direction will be the channel direction no matter what angle α° the pentacene 48a forms.

For each of the measurement samples prepared in the above-described manner, the carrier mobility of the TFT 100 was determined by measuring I-V characteristics while applying various gate voltages to the gate electrode. In addition, an angle θ was determined by obtaining the conductivity between the source electrode and the drain electrode in the case where the angle α° formed was 0° (which corresponds to the conductivity σ1 along a direction represented by the molecular axis of the main chains of the π-conjugated organic semiconductor molecules) and the conductivity in the case where the angle α° formed was 90° (which corresponds to the conductivity σ2 along a perpendicular direction to the orientation direction and along a direction of existence of the π-electron clouds; in reality, no sample with a perfect 90° orientation could be obtained, but a sample that is closest to 90° was used to represent the 90° orientation sample), and substituting these conductivity values into the foregoing Equation (1).

$$\theta = \arctan(\sigma2/\sigma1) \quad (1)$$

Figure 10A:
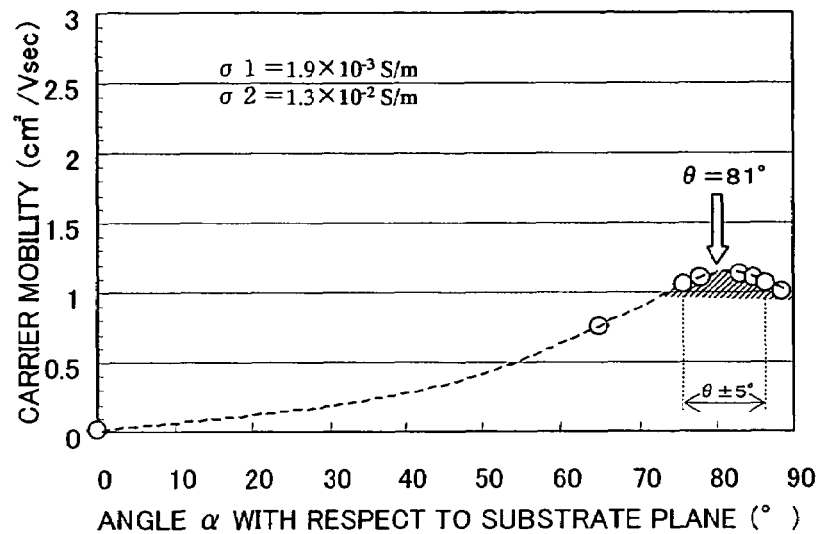
FIG. 10A shows the measurement results in the case where the gate voltage is 20 V.
Figure 10B:
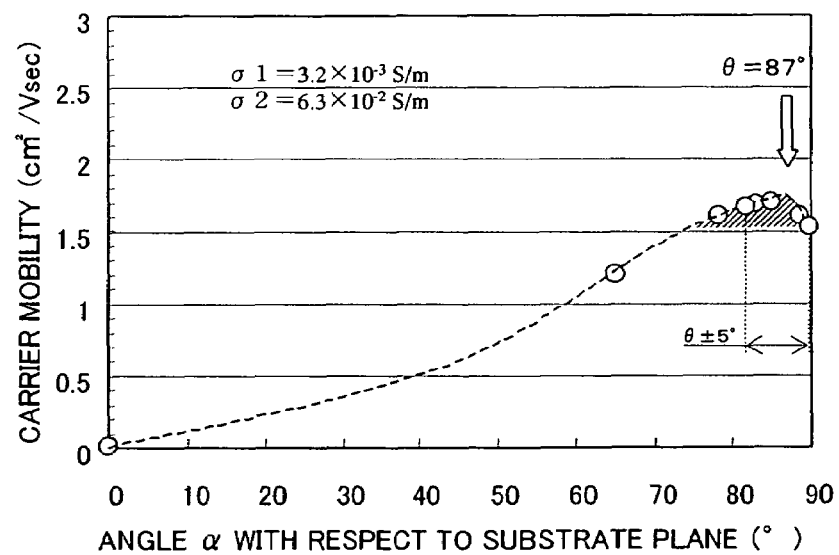
FIG. 10B shows the measurement results in the case where the gate voltage is 40 V.

FIG. 10 shows graphs illustrating the results of the measurements in which changes in the carrier mobility are measured at varying orientation angles of the pentacene while applying various gate voltages. FIG. 10A shows the measurement results in the case where the gate voltage is 20 V, and FIG. 10B shows the measurement results in the case where the gate voltage is 40 V. In FIG. 10 as well, the horizontal axis and the vertical axis represent the same as in FIG. 6.

As shown in FIG. 10A, when the gate voltage was 20 V, the conductivity σ1 was $1.9 \times 10^{-3}$ S/m and the conductivity σ2 was $1.3 \times 10^{-2}$ S/m. It was found that although the carrier mobility was lowest when the orientation angle of the pentacene was 0°, the mobility gradually increased as the orientation angle became greater from 0°, and it gradually decreased after it reached a peak in the vicinity of angle θ=81°, which was determined by the foregoing Equation (1).

As shown in FIG. 10B, when the gate voltage is 40 V, the conductivity σ1 was $3.2 \times 10^{-3}$ S/m and the conductivity σ2 was $6.3 \times 10^{-2}$ S/m. It was found that although the carrier mobility was lowest when the orientation angle of the pentacene was 0°, the mobility gradually increased as the orientation angle became greater from 0°, and it gradually decreased after it reached a peak in the vicinity of angle θ=87°, which was determined by the foregoing Equation (1).

Thus, it was found that the carrier mobility of the semiconductor layer 48 improves compared to the case where the orientation angle of the pentacene is 0° as the orientation angle is increased from 0° (that is, in the case where the molecular axis of the pentacene is oriented parallel to the substrate plane and the π-conjugated organic semiconductor molecules are not formed so that the π orbitals of the adjacent molecules oppose each other in the direction from the source electrode to the drain electrode). Also, it was found that the carrier mobilities in the hatched regions in FIGS. 10A and 10B improve when the orientation angle of the pentacene is in the vicinity of 90°, that is, when the molecular axis of the pentacene is perpendicular to the substrate plane and the molecular axis of the main chains of the π-conjugated organic semiconductor molecules is perpendicular to the perpendicular line to the opposing sides of the source electrode and the drain electrode. Moreover, it was found that the orientation angle at which the highest carrier mobility can be obtained is in the vicinity of the angle θ calculated according to Equation (1) using the conductivity σ1 in the case where the orientation angle is 0° and the conductivity σ2 in the case where the orientation angle is 90°. Furthermore, as the result of a further study on a preferable range of the orientation angle of the pentacene, it became clear that, as seen from FIGS. 10A and 10B, the range of ±5° from the angle θ determined by Equation (1) is most desirable (the portion that exceeds 90° is excluded, however).

It should be noted that although the present embodiment has explained the cases of using pentacene as the π-conjugated organic semiconductor molecules used for the semiconductor layer, the advantageous effects of the present invention are not limited by this material. In other words, because the advantageous effects attained by the present invention are achieved by the positional relationship between the substrate plane and the orientation direction of the molecular axis of the π-conjugated organic semiconductor molecules, which constitute the semiconductor layer, the same advantageous effects will be obtained even when other π-conjugated organic semiconductor molecules are employed. For example, it is possible to use other oligoacenes with a different number of six-membered rings, such as tetracene, or oligoacene-based derivatives obtained by substituting or chemically modifying a portion of the structure of the oligoacenes.

Moreover, although the first embodiment and the second embodiment have respectively described a case of using a derivative of thiophene-based polymer and a case of using a derivative of acene-based polymer as examples, the advantageous effects of the present invention are not limited by these materials and the same advantageous effects are attained even when derivatives of acetylene-based, pyrrole-based, or phenylene-based polymers are used, as long as the orientation direction is controlled in forming the films in accordance with the main concept of the present invention. Furthermore, similar advantageous effects to the advantageous effects of the present invention are attained also when using derivatives of copolymers of any combinations of the foregoing materials. Further, if a crystalline material is selected in selecting a material from these materials, as in the case of the pentacene illustrated in the second embodiment, it is possible to obtain further higher carrier mobility than the case of using non-crystalline materials.

In addition, the first and second embodiments employed a material containing an organic material PEDOT as its main component and Au, respectively, as the electrode materials for the source electrode, the drain electrode, and the gate electrode; however, it is possible to use other conductive polymer materials or use inorganic materials such as ITO and Cu. Nevertheless, in order to construct a TFT having mechanical flexibility and shock resistance, it is preferable to select a material that has elasticity, or select an electrode configuration that is not easily affected by bending. In addition, although the materials for the gate insulating layer and the substrate are not limited to the materials used in the first and second embodiments either, it is preferable to select a material having elasticity or a material that does not easily affected by bending, as with the electrodes.

The first embodiment has described, as the method for orienting the oligothiophene derivative molecules in a predetermined direction, a method in which grooves are provided in the substrate and oligothiophene derivative molecules dispersed in a solvent are applied and then dried. The second embodiment has described, as the method for orienting the pentacene in a predetermined direction, a method in which an alignment layer is provided on the gate insulating layer, which serves as the base layer, and a film is formed by vacuum evaporation under predetermined conditions. However, because the advantageous effects of the present invention are achieved by the positional relationship of the orientation direction of the semiconductor layer with the source electrode and the drain electrodes, or with the substrate plane, as discussed above, it does not matter what method of orientation is used. For example, the same advantageous effects can be obtained even when the orientation and film deposition are effected with the LB method, the drawing method, or the method in which polytetrafluoroethylene is pressed onto a substrate with a certain pressure and is slid to form an orientation and an organic semiconductor is brought into contact therewith, or the method in which π-conjugated oligomer molecules are orientation-deposited using a hot wall epitaxy method, which were described in the background art. Furthermore, it is possible to use a method in which a side chain of the π-conjugated organic semiconductor molecule is chemically modified by a liquid crystalline substituent so that the orientation is controlled by utilizing the effect of the substituent.

Furthermore, It should be noted that although the orientation angles that are believed to be most desirable at the respective gate voltages were shown as angles θ regarding the materials used in the first and second embodiments, these are not uniquely determined depending on the materials. Specifically, even with the same material, the conductivities σ1 and σ2 may vary depending on the conditions of the film deposition, the configuration of the TFT, or the like. Nevertheless, by determining the orientation angle in accordance with the main concept of the present invention, it becomes possible to construct a TFT that achieves the highest carrier mobility under actual use conditions.

Third Embodiment

A third embodiment of the present invention describes a sheet-like flexible display, a wireless ID tag, and a portable device such as a portable television, a telecommunication terminal, and a portable medical device, as application examples that use the TFTs described in the first and second embodiments.

First, an example of the configuration of an active matrix-type display that employs an organic EL for its display unit will be described as the sheet-like flexible display.

Figure 11:
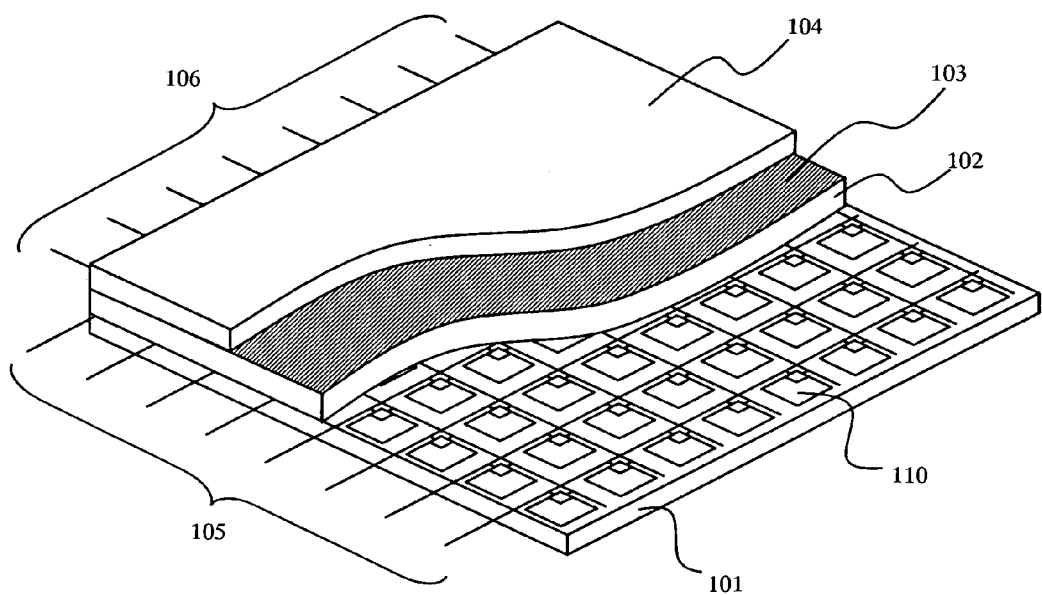
FIG. 11 is a perspective view schematically illustrating the configuration of an active matrix-type display that uses organic EL as its display unit.

FIG. 11 is a perspective view schematically illustrating the configuration of an active matrix-type display that uses an organic EL as its display unit, according to the present embodiment.

Figure 12:
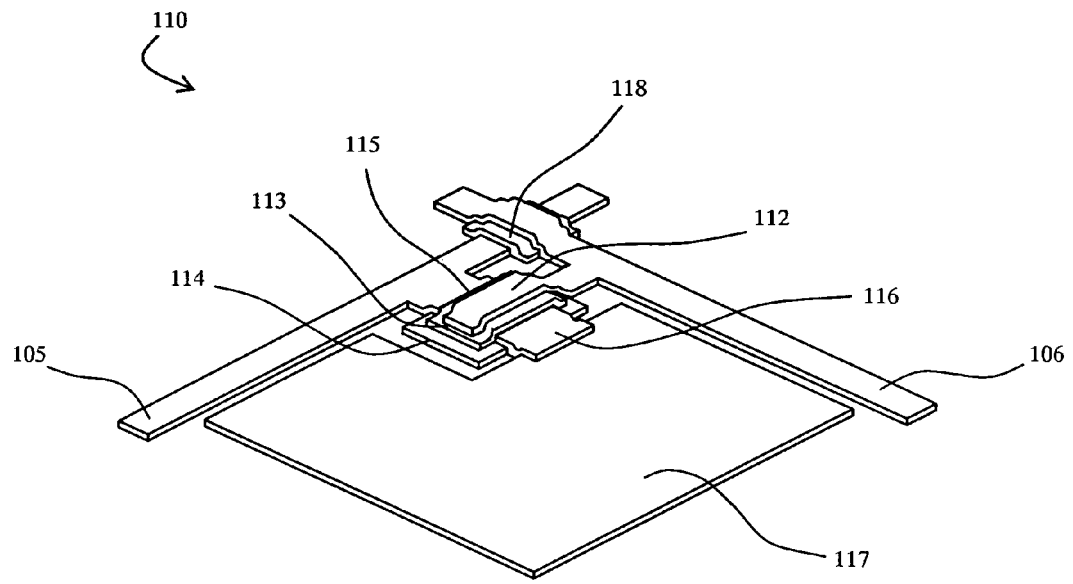
FIG. 12 is a schematic view illustrating the configuration of the TFT driving circuit unit enlarged.

As illustrated in FIG. 11, the active matrix-type display according to the present embodiment has a TFT driving circuit 110 that is arranged on a plastic substrate 101 in an array form and is connected to pixel electrodes, and an organic EL layer 102 and a protective film 104 are arranged on the TFT driving circuit 110. A transparent electrode 103 is provided on the upper surface of the organic EL layer 102. Here, the organic EL layer 102 is configured by stacking such layers as an electron transport layer, a light-emitting layer, and a hole transport layer. Source electrode lines 105 and gate electrode lines 106, each being extended from predetermined electrodes of respective electrodes, are connected to a control circuit, which is not shown in the figure. Here, an enlarged view of the TFT driving circuit unit 110 is shown in FIG. 12.

The stacking configuration of the TFT itself is basically the same as the stacking structure shown in the first embodiment. Specifically, the TFT shown in FIG. 12 is formed by stacking a semiconductor layer 114, a source electrode 115 and a drain electrode 116, a gate insulating layer 113, and a gate electrode 112. As illustrated in FIG. 12, the drain electrode 116 is electrically connected to a pixel electrode 117 of the organic EL. Further, an insulating layer 118 is disposed at a location where the gate electrode line 106 connected to the gate electrode 112 intersects with the source electrode line 105 connected to the source electrode 115.

Thus, by constructing an active matrix-type display utilizing the TFTs described in the first and second embodiments, the TFT components can be fabricated by a low-cost process; therefore, the display as a whole can be constructed at low cost and a sheet-like display that is excellent in mechanical flexibility and shock resistance can be achieved. Moreover, it becomes possible to provide an active matrix-type display with fast display speed (response speed).

It should be noted that although the present embodiment has described a case in which an organic EL is used for the display unit, the advantageous effects of the present invention are not limited to the active matrix-type display with this configuration. Specifically, as long as the active matrix-type display requires a TFT circuit, the advantageous effects will be exhibited likewise.

In addition, the configuration of the driving circuit unit for driving pixels is not limited to the configuration shown in the present embodiment. Specifically, for example, it is possible to adopt a configuration in which a TFT for driving current and a switching TFT for controlling the former are combined to drive one pixel. Further, it is possible to employ a circuit configuration in which a further plurality of TFTs are incorporated.

Next, a case in which the TFT according to the present invention is applied to a wireless ID tag will be described.

Figure 13:
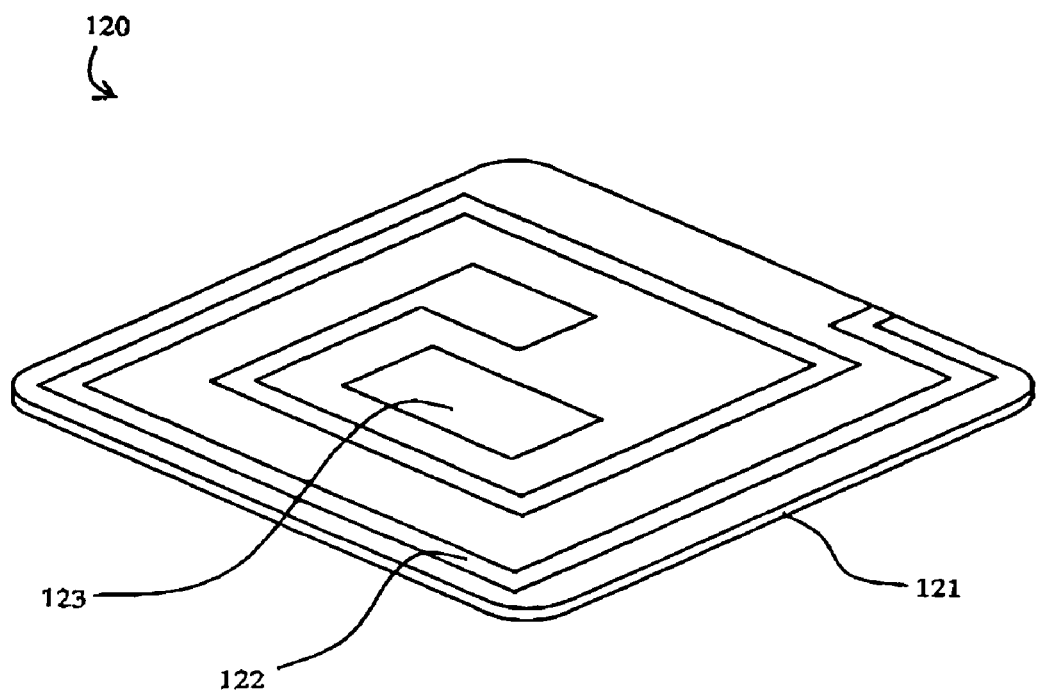
FIG. 13 is a perspective view schematically illustrating the configuration of a wireless ID tag that employs TFTs according to the present embodiment.

FIG. 13 is a perspective view schematically illustrating a wireless ID tag that uses a TFT, according to the present embodiment.

As illustrated in FIG. 13, a wireless ID tag 120 according to the present embodiment uses a film-shaped plastic substrate 121 as a base material. An antenna unit 122 and a memory IC unit 123 are provided on this substrate 121. The memory IC unit 123 can be constructed utilizing the TFTs described in the first and second embodiments. The wireless ID tag 120 is provided with an adhesive function so that it can be adhered onto items that are not flat, such as bags for confectionery or snack items or beverage cans. Additionally, a protective film may be provided on the surface of the wireless ID tag 120 as necessary.

Thus, by constructing a wireless ID tag utilizing the TFTs described in the first and second embodiments, it becomes possible to embody a wireless ID tag that is capable of adhering to items of various shapes or various materials. Moreover, it becomes possible to provide a wireless ID tag having fast response speed (processing speed).

It should be noted that the advantageous effects of the present invention are not limited by the configuration of the wireless ID tag shown in FIG. 13. Accordingly, the arrangements and configurations of the antenna unit and the memory IC unit may be determined as appropriate. For example, it is also possible to incorporate a logic circuit into the wireless ID tag.

Furthermore, although the present embodiment has described an embodiment in which the antenna unit 122 and the memory IC unit 123 have been formed on the plastic substrate 121 in advance, the present invention is not limited to this embodiment, and it is possible to form the wireless ID tag directly on a target object by using such a method as ink jet printing. In that case as well, by utilizing the configurations of the TFTs according to the present invention, it becomes possible to manufacture a high-performance wireless ID tag with good mechanical flexibility and good impact resistance at low cost.

Figure 14:
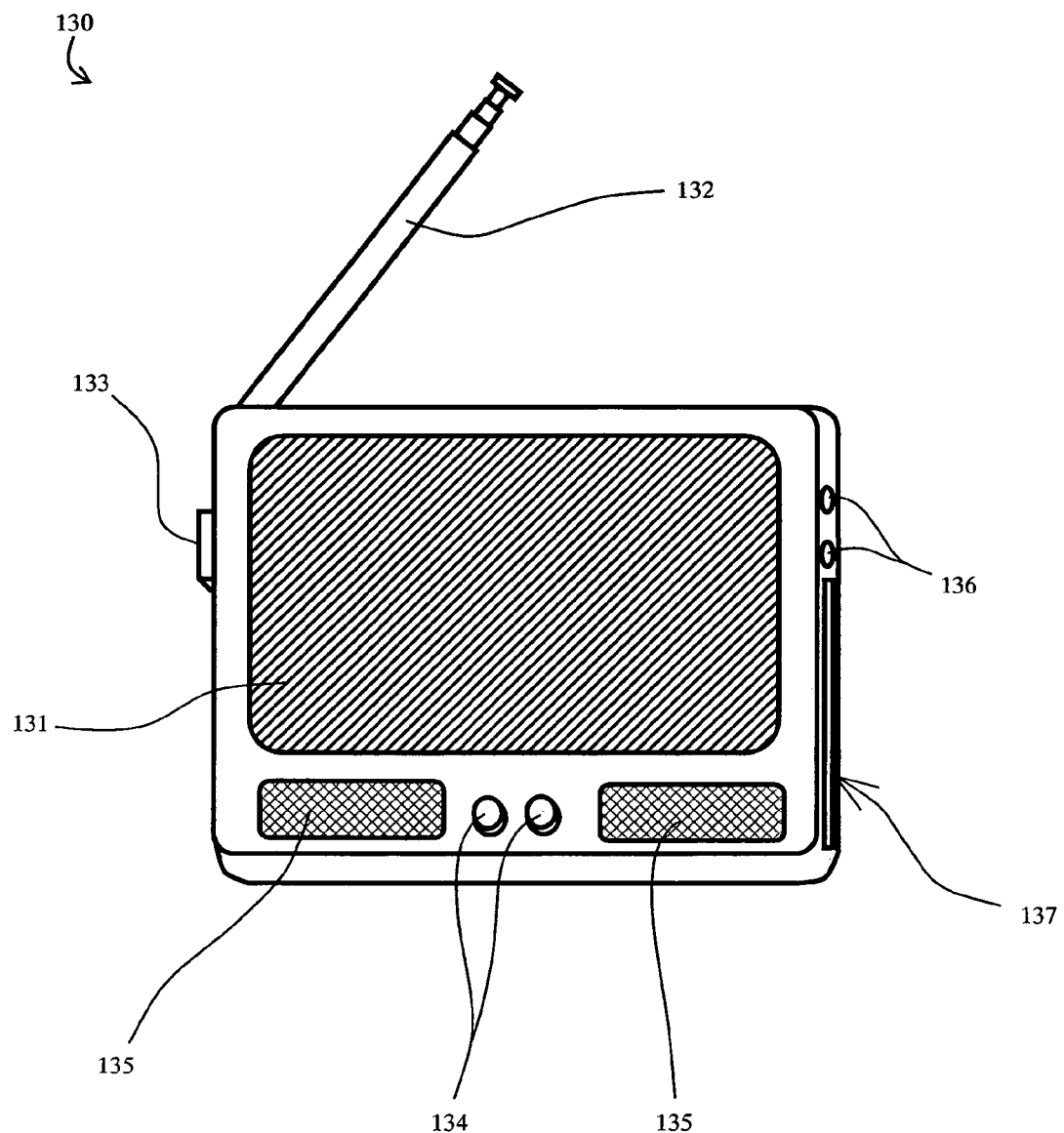
FIG. 14 is a front view schematically illustrating the configuration of a portable television that employs TFTs according to the present embodiment.
Figure 15:
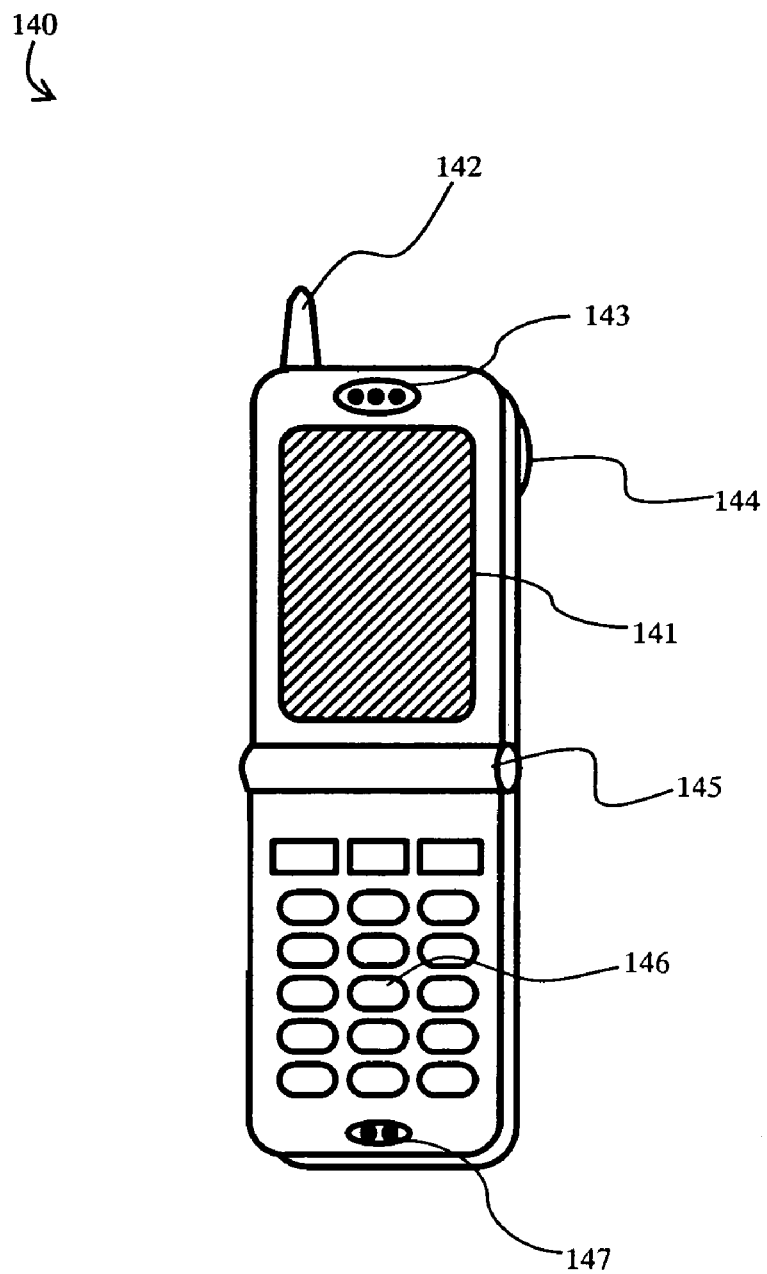
FIG. 15 is a front view schematically illustrating the configuration of a mobile telephone that employs TFTs according to the present embodiment.
Figure 16:
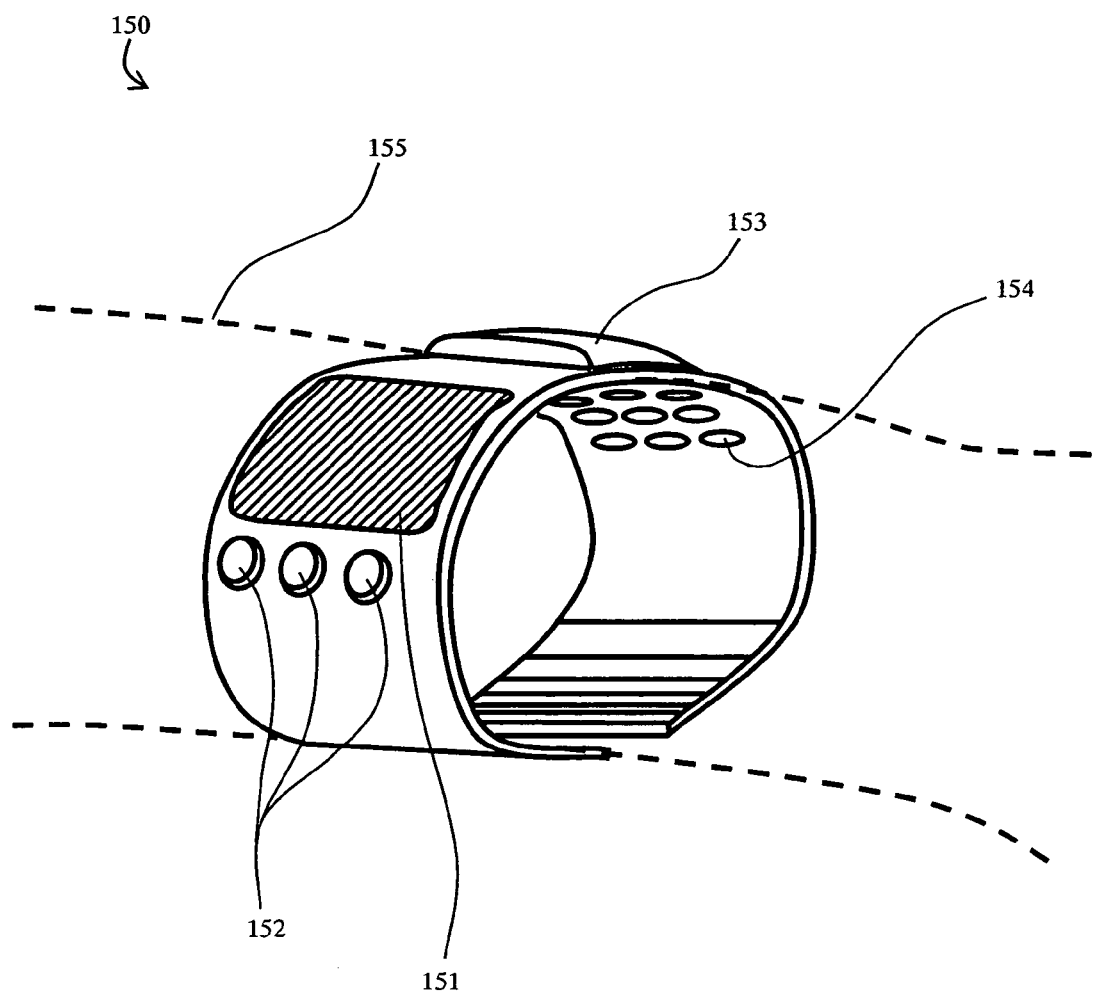
FIG. 16 is a perspective view schematically illustrating the configuration of a portable medical device that employs TFTs according to the present embodiment.

Lastly, cases in which the TFT according to the present invention are applied to portable devices will be described. FIGS. 14 to 16 show several specific application examples of portable devices that utilize TFTs according to the present invention.

First, a case in which the TFTs according to the present invention are applied to a portable television will be described.

FIG. 14 is a front view schematically illustrating the configuration of the portable television that employs TFTs, according to the present embodiment.

As illustrated in FIG. 14, a portable television 130 according to the present embodiment is furnished with the following: a display unit 131, which is composed of a liquid crystal display device or the like for displaying television images; a receiver unit 132, which is made of a rod antenna that can be freely extended and pushed-in and is capable of receiving broadcast radio wave; a power switch 133, which controls ON/OFF of the power supply to the portable television 130; control buttons 134 for adjusting sound volume of the audio output from a later-described audio output device 135 and selecting a channel of received television broadcasting; an audio output unit 135 composed of a speaker or the like for outputting television sound; input/output terminals 136 for inputting audio signal and image signal to the portable television 130 or outputting the signals from the portable television 130; and a recording medium insertion unit 137, which accommodates a recording medium for recording the audio signal and the image signal related to the received television broadcasting as necessary.

Although not particularly shown in FIG. 14, this portable television 130 has integrated circuits such as ICs and LSIs in the interior thereof. The integrated circuits that utilize the TFTs according to the present invention are used as appropriate for arithmetic elements, memory elements, switching elements, and the like that construct the portable television 130. Thereby, the portable television 130 functions as a portable type television receiver.

Next, a case in which the TFTs according to the present invention are applied to a telecommunication terminal. Herein, a mobile telephone is shown as an example of the telecommunication terminal.

FIG. 15 is a front view schematically illustrating the configuration of a mobile telephone that utilizes TFTs, according to the present embodiment.

As illustrated in FIG. 15, a mobile telephone 140 according to the present embodiment is furnished with the following: a display unit 141 composed of a liquid crystal display device or the like for displaying telephone numbers, etc.; a transceiver unit 142 that is composed of freely storable whip antenna and is capable of transmitting and receiving telecommunication wave; an audio output unit 143 composed of a speaker or the like for outputting telecommunication sound; a camera unit 144 having a CCD element capable of taking photographs; a movable hinge joint part 145 for folding the mobile telephone 140 as necessary; a plurality of control buttons 146 for inputting telephone numbers and characters; and an audio input unit 147 composed of a capacitor microphone.

Although not particularly shown in FIG. 15, this mobile telephone 140 has integrated circuits such as ICs and LSIs in the interior thereof. The integrated circuits that utilize the TFTs according to the present invention are used as appropriate for arithmetic elements, memory elements, switching elements, and the like that construct the mobile telephone 140. Thereby, the mobile telephone 140 functions as a portable type telecommunication terminal.

Next, a case in which the TFT according to the present invention is applied to a portable medical device will be described.

FIG. 16 is a perspective view schematically illustrating the configuration of a portable medical device that employs TFTs, according to the present embodiment. Here, a portable medical device that automatically performs a medical treatment to a patient, such as delivering drugs, based on acquired biometric information is described as an example of the portable medical device. In FIG. 16, a human arm 155 of a later-described patient is illustrated transparently.

As illustrated in FIG. 16, a portable medical device 150 according to the present embodiment is furnished with the following: a display unit 151 composed of a liquid crystal display device or the like for displaying the operation state of the device, acquired biometric information, and so forth; control buttons 152 for performing setting or the like related to the operations of the portable medical device 150; a medical treatment unit 153 for processing biometric information acquired by a later-described percutaneous contact portion 154 and performing a medical treatment to the patient such as delivering drugs through the percutaneous contact portion 154 based on the result of the processing; and a percutaneous contact portion 154 for successively collecting biometric information of the patient for the medical treatment and substantially performing the medical treatment.

When this portable medical device 150 is used to perform a medical treatment to a patient, the portable medical device 150 may be carried about while being wrapped around a human arm 155 of the patient, for example, as illustrated in FIG. 16. In this worn state shown in FIG. 16, the percutaneous contact portion 154 and the surface of the human arm 155 of the patient are in close contact with each other. The portable medical device 150 acquires biometric information for a medical treatment from the human arm 155 via the percutaneous contact portion 154 in this worn state shown in FIG. 16. When the biometric information of the patient is acquired, the acquired biometric information is input into the medical treatment unit 153. The medical treatment unit 153 performs predetermined processing for the acquired biometric information for the medical treatment. Based on the result of the processing, the medical treatment such as delivering drugs is carried out by the medical treatment unit 153 to the patient through the percutaneous contact portion 154.

Although not particularly shown in FIG. 16, this portable medical device 150 has integrated circuits such as ICs and LSIs in the interior thereof. The integrated circuits that utilize the TFTs according to the present invention are used as appropriate for arithmetic elements, memory elements, switching elements, and the like that construct the potable medical device 150. Thereby, the potable medical device 150 functions as a potable type medical device.

Thus, by constructing portable devices using the integrated circuits utilizing the TFTs described in the first and second embodiments, the following advantageous effects are attained. Specifically, while various device elements using semiconductor properties, such as arithmetic elements, memory elements, and switching elements, are utilized as the integrated circuits in the above-described portable devices, the TFTs according to the present invention may be utilized for constructing some portions of the device elements in the foregoing portable devices if the devices require the performance that may be considered as the advantages of organic materials, such as mechanical flexibility, shock resistance, safety to environment at disposal, being lightweight, and being low-cost; thereby, high-performance device elements can be realized at low cost. As the consequence, a portable device that also has the above-listed advantages can be fabricated at low cost.

Although the third embodiment has described several examples of the portable devices to which the TFTs according to the present invention may be applied, it should be construed that the configurations of the illustrated devices are not limited to the above-described configurations. It should be considered also that the portable devices to which the TFTs according to the present invention are applicable are not limited to the above-described devices. For example, the TFTs according to the present invention can be suitably applied to various devices such as PDA terminals, wearable AV devices, portable computers, and wrist watch-type telecommunication devices, which require such characteristics as mechanical flexibility, shock resistance, safety to environment at disposal, being lightweight, and being low-cost.

It should be noted that although the present invention was applied to the TFTs having the configurations shown in FIGS. 1B and 1C in the first and second embodiments, the present invention may be applied to the TFTs having the configurations shown in FIGS. 1A and 1D likewise. In FIG. 1A, a gate electrode 12, a gate insulating layer 13, and a semiconductor layer 14 are stacked on top of a substrate 11, and a source electrode 15 and a drain electrode 16 are stacked on the semiconductor layer 14. In FIG. 1D, a source electrode 15, a drain electrode 16, a semiconductor layer 14, and a gate insulating layer 13 are stacked on top of a substrate 11, and a gate electrode 12 is stacked on the gate insulating layer 13.

Although the first and second embodiments have described the cases in which the source electrode and the drain electrode have a rectangular shape, the present invention may be suitably applied also to other cases as long as the source electrode and the drain electrode are formed so as to have mutually opposing sides when viewed in plan. Even when the source electrode and the drain electrode have an arbitrary shape, the present invention may be suitably applied by orienting the molecular axis of the main chains of the direction π-conjugated organic semiconductor so as to be inclined with respect to the direction of electric field in the channel formed in the semiconductor layer.

The first and second embodiments have described the configurations of the thin film transistors each having a source electrode and a drain electrode that are provided to be isolated from each other so as to have mutually opposing sides when viewed in plan; however, various configurations may be adopted other than this configuration. For example, in the configuration having a source electrode and a drain electrode provided to be isolated from each other so as to have mutually opposing sides in the thickness direction, it is possible to adopt a configuration in which the π-conjugated organic semiconductor molecules are oriented so that π orbitals thereof substantially oppose each other and that the molecular axis of the main chains is oriented to be inclined with respect to the direction perpendicular to the opposing sides. Even with such a configuration, the same advantageous effects as those in the first and second embodiments will be attained.

The present invention is configured as described above, and the invention can provide a TFT with improved carrier mobility that is configured by orientation-forming π-conjugated organic semiconductor molecules in a predetermined direction, and a method of fabricating the TFT. Moreover, the invention can provide an active matrix-type display in which a plurality of the TFTs with improved carrier mobility are disposed, a wireless ID tag that uses the TFT with improved carrier mobility for its integrated circuit section, a portable device that uses the TFT with improved carrier mobility for its integrated circuit section, and so forth.

From the foregoing description, numerous improvements and other embodiments of the present invention will be readily apparent to those skilled in the art. Accordingly, the foregoing description is to be construed only as illustrative examples and as being presented for the purpose of suggesting the best mode for carrying out the invention to those skilled in the art. Various changes and modifications can be made in specific structures and/or functions substantially without departing from the scope and sprit of the invention.

INDUSTRIAL APPLICABILITY

The TFT and the method of fabricating the TFT according to the present invention are useful as a TFT with improved carrier mobility that is configured by orientation-forming π-conjugated organic semiconductor molecules in a predetermined direction, and a method of fabricating the TFT. The TFT according to the present invention is useful for fabricating sheet-like or paper-like active matrix-type displays, wireless ID tags, portable devices such as portable televisions and mobile telephones, and so forth.

The invention claimed is:

1. A thin film transistor comprising: a semiconductor layer; and a source region and a drain region provided to be isolated from each other so as to mutually oppose the semiconductor layer, wherein
the semiconductor layer has π-conjugated organic semiconductor molecules as its main component; and
the π-conjugated organic semiconductor molecules are oriented so that π orbitals thereof substantially oppose each other and that a molecular axis of main chains thereof is oriented to be oblique with respect to a direction of electric field in a channel formed in the semiconductor layer.

2. The thin film transistor according to claim 1, wherein:
the source region and the drain region are provided to be isolated from each other so as to have mutually opposing sides facing the semiconductor layer; and
the π-conjugated organic semiconductor molecules are oriented so that the molecular axis of the main chains is inclined with respect to a direction perpendicular to the opposing sides.

3. The thin film transistor according to claim 2, further comprising:
a gate electrode provided on at least one surface of the semiconductor layer with a gate insulating layer interposed therebetween; and
the molecular axis of the main chains of the π-conjugated organic semiconductor molecules is oriented substantially in an orientation direction that is inclined at an angle θ with respect to the direction perpendicular to the opposing sides or opposing planes of the source region and the drain region, the angle θ determined by the following equation (1):

$$\theta = \arctan(\sigma 2/\sigma 1), \quad (1)$$

where σ1 is a conductivity along the molecular axis direction of the main chains of the π-conjugated organic semiconductor molecules and σ2 is a conductivity along the direction perpendicular to the molecular axis direction and along the π orbital axis direction, the conductivities being determined in a state in which a voltage substantially equivalent to that when the thin film transistor is ON is applied to the gate electrode.

4. The thin film transistor according to claim 3, wherein the molecular axis of the main chains of the π-conjugated organic semiconductor molecules is oriented so as to exist within a plane substantially parallel to a principal plane of the semiconductor layer, and a range of the orientation is the angle θ±10°.

5. The thin film transistor according to claim 3, wherein the molecular axis of the main chains of the π-conjugated organic semiconductor molecules is oriented so as not to exist within a plane substantially parallel to a principal plane of the semiconductor layer, and a range of the orientation is the angle θ±5°.

6. The thin film transistor according to claim 1, wherein:
the source region and the drain region are provided to be isolated from each other so as to have mutually opposing planes facing the semiconductor layer; and
the π-conjugated organic semiconductor molecules are oriented so that the molecular axis of the main chains is inclined with respect to a direction perpendicular to the opposing planes.

7. The thin film transistor according to claim 1, wherein the π-conjugated organic semiconductor molecules are made of a derivative having as its main chain a molecular structure of one of thiophene, acetylene, pyrrole, phenylene, and acene, or combinations thereof.

8. The thin film transistor according to claim 7, wherein the π orbitals do not extend from the π-conjugated organic semiconductor molecules in the same vector direction.

9. The thin film transistor according to claim 7, wherein the π conjugated organic semiconductor molecules are crystalline.

10. An active matrix-type display comprising a plurality of thin film transistors according to claim 1, as switching elements for driving pixels.

11. A wireless ID tag comprising a thin film transistor according to claim 1 as a semiconductor element for constructing an integrated circuit.

12. A portable device comprising a thin film transistor according to claim 1 as a semiconductor element for constructing an integrated circuit.

* * * * *